United States Patent  
Park et al.

(10) Patent No.: US 10,246,769 B2
(45) Date of Patent: *Apr. 2, 2019

(54) THIN FILM DEPOSITION APPARATUS

(75) Inventors: Hyun-Sook Park, Yongin (KR);
Chang-Mog Jo, Yongin (KR);
Hee-Cheol Kang, Yongin (KR);
Yun-Mi Lee, Yongin (KR); Un-Cheol Sung, Yongin (KR); Yong-Sup Choi, Yongin (KR); Jong-Heon Kim, Yongin (KR); Jae-Kwang Ryu, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 842 days.

This patent is subject to a terminal disclaimer.

(21) Appl. No.: 12/979,656

(22) Filed: Dec. 28, 2010

(65) Prior Publication Data

US 2011/0165327 A1   Jul. 7, 2011

(30) Foreign Application Priority Data

Jan. 11, 2010 (KR) .................. 10-2010-0002381

(51) Int. Cl.
*C23C 14/00* (2006.01)
*C23C 14/24* (2006.01)
(Continued)

(52) U.S. Cl.
CPC ............ *C23C 14/24* (2013.01); *C23C 14/042* (2013.01); *H01L 51/001* (2013.01)

(58) Field of Classification Search
None
See application file for complete search history.

(56) References Cited

U.S. PATENT DOCUMENTS 4,325,986 A    4/1982 Baron et al.
4,416,217 A   11/1983 Nakamura et al.
(Continued)

FOREIGN PATENT DOCUMENTS

CN    2425263 Y    3/2001
CN    1476279 A    2/2004
(Continued)

OTHER PUBLICATIONS

Patent Abstracts of Japan and English machine translation of JP 2004-349101 list above (11 pages).
(Continued)

*Primary Examiner* — Francisco W Tschen
(74) *Attorney, Agent, or Firm* — Lewis Roca Rothgerber Christie LLP

(57) ABSTRACT

A thin film deposition apparatus that can be simply applied to produce large-sized display devices on a mass scale and that improves manufacturing yield. The thin film deposition apparatus includes a deposition source that discharges a deposition material; a deposition source nozzle unit disposed at a side of the deposition source and including a plurality of deposition source nozzles arranged in a first direction; and a patterning slit sheet disposed opposite to the deposition source nozzle unit and including a plurality of patterning slits arranged in a second direction that is perpendicular to the first direction. A deposition is performed while the substrate or the thin film deposition apparatus moves relative to each other in the first direction, and the deposition source, the deposition source nozzle unit, and the patterning slit sheet are formed integrally with each other.

56 Claims, 12 Drawing Sheets

(51) Int. Cl.
*C23C 14/04* (2006.01)
*H01L 51/00* (2006.01)

(56) References Cited

U.S. PATENT DOCUMENTS

| | | |
|---|---|---|
| 4,468,648 A | 8/1984 | Uchikune |
| 4,687,939 A | 8/1987 | Miyauchi et al. |
| 4,792,378 A | 12/1988 | Rose et al. |
| 4,901,667 A | 2/1990 | Suzuki et al. |
| 5,454,847 A | 10/1995 | Jacoboni et al. |
| 5,460,654 A | 10/1995 | Kikkawa et al. |
| 5,487,609 A | 1/1996 | Asada |
| 5,742,129 A | 4/1998 | Nagayama et al. |
| 5,774,145 A | 6/1998 | Morita et al. |
| 5,909,995 A | 6/1999 | Wolf et al. |
| 6,045,671 A | 4/2000 | Wu et al. |
| 6,091,195 A | 7/2000 | Forrest et al. |
| 6,099,649 A | 8/2000 | Schmitt et al. |
| 6,222,198 B1 | 4/2001 | Brown |
| 6,274,198 B1 | 8/2001 | Dautartas |
| 6,280,821 B1 | 8/2001 | Kadunce et al. |
| 6,371,451 B1 | 4/2002 | Choi |
| 6,417,034 B2 | 7/2002 | Kitazume et al. |
| 6,443,597 B1 | 9/2002 | Natori |
| 6,483,690 B1 | 11/2002 | Nakajima et al. |
| 6,541,130 B2 | 4/2003 | Fukuda |
| 6,554,969 B1 | 4/2003 | Chong |
| 6,579,422 B1 | 6/2003 | Kakinuma |
| 6,589,673 B1 | 7/2003 | Kido et al. |
| 6,650,023 B2 | 11/2003 | Kim |
| 6,699,324 B1 | 3/2004 | Berdin et al. |
| 6,749,906 B2 | 6/2004 | Van Slyke |
| 6,776,847 B2 | 8/2004 | Yamazaki et al. |
| 6,837,939 B1 | 1/2005 | Klug et al. |
| 6,878,209 B2 | 4/2005 | Himeshima et al. |
| 6,946,783 B2 | 9/2005 | Kim |
| 6,955,726 B2 * | 10/2005 | Kang .......... C23C 14/042 118/504 |
| 6,995,035 B2 | 2/2006 | Cok et al. |
| 7,006,202 B2 | 2/2006 | Byun et al. |
| RE39,024 E | 3/2006 | Takahashi |
| 7,078,070 B2 | 7/2006 | Peng |
| 7,199,520 B2 | 4/2007 | Fujii et al. |
| 7,282,855 B2 | 10/2007 | Park et al. |
| 7,322,248 B1 | 1/2008 | Long |
| 7,495,389 B2 | 2/2009 | Noguchi et al. |
| 7,601,439 B2 | 10/2009 | Chun et al. |
| 7,776,457 B2 | 8/2010 | Lee et al. |
| 7,872,256 B2 | 1/2011 | Sung et al. |
| 7,910,386 B2 | 3/2011 | Shiang et al. |
| 7,964,037 B2 | 6/2011 | Fukuda et al. |
| 8,022,448 B1 | 9/2011 | Luu et al. |
| 8,128,753 B2 | 3/2012 | Bulovic et al. |
| 8,137,466 B2 | 3/2012 | Kang et al. |
| 8,188,476 B2 | 5/2012 | Takagi et al. |
| 8,193,011 B2 | 6/2012 | Kang et al. |
| 8,673,077 B2 | 3/2014 | Sonoda et al. |
| 8,833,294 B2 * | 9/2014 | Lee .......... C03C 17/002 118/213 |
| 8,894,458 B2 * | 11/2014 | Song .......... C23C 14/042 313/504 |
| 8,968,829 B2 * | 3/2015 | Ryu et al. .......... 427/248.1 |
| 2001/0004186 A1 | 6/2001 | Song et al. |
| 2001/0006827 A1 | 7/2001 | Yamazaki et al. |
| 2001/0007244 A1 | 7/2001 | Matsuse |
| 2001/0019807 A1 | 9/2001 | Yamada et al. |
| 2001/0026638 A1 | 10/2001 | Sangu et al. |
| 2001/0034175 A1 | 10/2001 | Miyazaki et al. |
| 2002/0011785 A1 * | 1/2002 | Tang et al. .......... 313/506 |
| 2002/0017245 A1 | 2/2002 | Tsubaki et al. |
| 2002/0033136 A1 | 3/2002 | Savage et al. |
| 2002/0036759 A1 | 3/2002 | Ise et al. |
| 2002/0050061 A1 | 5/2002 | Komyoji et al. |
| 2002/0076847 A1 | 6/2002 | Yamada et al. |
| 2002/0168577 A1 | 11/2002 | Yoon |
| 2002/0179013 A1 * | 12/2002 | Kido et al. .......... 118/718 |
| 2002/0187253 A1 | 12/2002 | Marcus et al. |
| 2002/0194727 A1 | 12/2002 | Cho et al. |
| 2002/0197393 A1 | 12/2002 | Kuwabara |
| 2003/0021886 A1 | 1/2003 | Baele |
| 2003/0044517 A1 | 3/2003 | Nishikawa et al. |
| 2003/0101932 A1 | 6/2003 | Kang |
| 2003/0101937 A1 | 6/2003 | Van Slyke et al. |
| 2003/0117602 A1 | 6/2003 | Kobayashi et al. |
| 2003/0118950 A1 | 6/2003 | Chao et al. |
| 2003/0124764 A1 | 7/2003 | Yamazaki et al. |
| 2003/0151637 A1 | 8/2003 | Nakamura et al. |
| 2003/0164934 A1 | 9/2003 | Nishi et al. |
| 2003/0168013 A1 | 9/2003 | Freeman et al. |
| 2003/0173896 A1 | 9/2003 | Grushin et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0016907 A1 | 1/2004 | Shi |
| 2004/0028349 A1 | 2/2004 | Nagasaka et al. |
| 2004/0029028 A1 | 2/2004 | Shimizu |
| 2004/0056244 A1 * | 3/2004 | Marcus et al. .......... 257/40 |
| 2004/0062856 A1 | 4/2004 | Marcus et al. |
| 2004/0086639 A1 | 5/2004 | Grantham et al. |
| 2004/0096771 A1 | 5/2004 | Kashiwagi et al. |
| 2004/0115338 A1 | 6/2004 | Yoneda |
| 2004/0115342 A1 | 6/2004 | Shigemura |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0157167 A1 | 8/2004 | Morii |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2004/0255857 A1 | 12/2004 | Chow et al. |
| 2004/0263547 A1 | 12/2004 | Sugahara |
| 2004/0263771 A1 | 12/2004 | Jeong et al. |
| 2005/0001546 A1 | 1/2005 | Yamaguchi |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0039684 A1 | 2/2005 | Yi et al. |
| 2005/0054198 A1 | 3/2005 | Urn |
| 2005/0072359 A1 | 4/2005 | Kim |
| 2005/0072361 A1 | 4/2005 | Yang et al. |
| 2005/0079418 A1 | 4/2005 | Kelley et al. |
| 2005/0110400 A1 | 5/2005 | Nakamura |
| 2005/0118788 A1 | 6/2005 | Kuwahara et al. |
| 2005/0126493 A1 | 6/2005 | Jeong |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0166844 A1 | 8/2005 | Gralenski |
| 2005/0183670 A1 | 8/2005 | Grantham et al. |
| 2005/0186330 A1 | 8/2005 | Kim et al. |
| 2005/0213021 A1 | 9/2005 | Myoung |
| 2005/0217584 A1 | 10/2005 | Abiko et al. |
| 2005/0229848 A1 | 10/2005 | Shinriki et al. |
| 2005/0244580 A1 | 11/2005 | Cok et al. |
| 2005/0263074 A1 * | 12/2005 | Masuda et al. .......... 118/726 |
| 2005/0280356 A1 | 12/2005 | Murayama et al. |
| 2006/0011136 A1 | 1/2006 | Yamazaki et al. |
| 2006/0012280 A1 | 1/2006 | Kang et al. |
| 2006/0012771 A1 | 1/2006 | Jeong |
| 2006/0022590 A1 | 2/2006 | Aziz et al. |
| 2006/0040132 A1 | 2/2006 | Liao et al. |
| 2006/0045958 A1 | 3/2006 | Abiko et al. |
| 2006/0066231 A1 | 3/2006 | Nishikawa et al. |
| 2006/0090705 A1 | 5/2006 | Kim |
| 2006/0102078 A1 | 5/2006 | Fairbairn et al. |
| 2006/0103289 A1 | 5/2006 | Kim et al. |
| 2006/0110544 A1 | 5/2006 | Kim et al. |
| 2006/0113907 A1 | 6/2006 | Im et al. |
| 2006/0115585 A1 | 6/2006 | Bulovic et al. |
| 2006/0130766 A1 | 6/2006 | Kim et al. |
| 2006/0144325 A1 | 7/2006 | Jung et al. |

(56) References Cited

U.S. PATENT DOCUMENTS

| | | |
|---|---|---|
| 2006/0152641 A1 | 7/2006 | Brody |
| 2006/0164786 A1 | 7/2006 | Kobayashi et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2006/0267294 A1 | 11/2006 | Busse et al. |
| 2006/0269671 A1 | 11/2006 | Kim et al. |
| 2006/0272572 A1 | 12/2006 | Uematsu et al. |
| 2006/0278522 A1 | 12/2006 | Kim et al. |
| 2006/0278945 A1 | 12/2006 | Sakurai |
| 2006/0280588 A1 | 12/2006 | Blonigan et al. |
| 2007/0009552 A1 | 1/2007 | Whitehead et al. |
| 2007/0009652 A1 | 1/2007 | Manz et al. |
| 2007/0017445 A1 | 1/2007 | Takehara et al. |
| 2007/0022955 A1 | 2/2007 | Bender et al. |
| 2007/0024185 A1 | 2/2007 | Kitamura et al. |
| 2007/0046185 A1 | 3/2007 | Kim |
| 2007/0046913 A1 | 3/2007 | Shibazaki |
| 2007/0054044 A1 | 3/2007 | Shimosaki et al. |
| 2007/0075955 A1 | 4/2007 | Jung et al. |
| 2007/0077358 A1 | 4/2007 | Jeong et al. |
| 2007/0137568 A1 | 6/2007 | Schreiber |
| 2007/0148337 A1 | 6/2007 | Nichols et al. |
| 2007/0148348 A1 | 6/2007 | Huh et al. |
| 2007/0157879 A1 | 7/2007 | Yotsuya |
| 2007/0158471 A1 | 7/2007 | Park et al. |
| 2007/0163497 A1 | 7/2007 | Grace et al. |
| 2007/0178708 A1* | 8/2007 | Ukigaya ............... C23C 14/044 438/758 |
| 2007/0190235 A1 | 8/2007 | Yamazaki et al. |
| 2007/0195844 A1 | 8/2007 | Ma et al. |
| 2007/0231460 A1 | 10/2007 | Ukigaya |
| 2007/0235157 A1 | 10/2007 | Bunker et al. |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0038935 A1 | 2/2008 | Baude et al. |
| 2008/0057183 A1 | 3/2008 | Spindler et al. |
| 2008/0100204 A1 | 5/2008 | Kim |
| 2008/0115729 A1 | 5/2008 | Oda et al. |
| 2008/0118743 A1 | 5/2008 | Lee et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0176414 A1 | 7/2008 | Im |
| 2008/0202421 A1 | 8/2008 | Allen et al. |
| 2008/0216741 A1 | 9/2008 | Ling et al. |
| 2008/0238294 A1 | 10/2008 | Xu et al. |
| 2008/0251785 A1 | 10/2008 | Noh et al. |
| 2008/0284324 A1 | 11/2008 | Chun et al. |
| 2008/0286461 A1 | 11/2008 | Noguchi et al. |
| 2008/0290791 A1 | 11/2008 | Lee et al. |
| 2008/0298947 A1 | 12/2008 | Yeo et al. |
| 2008/0309718 A1 | 12/2008 | Oya et al. |
| 2009/0001882 A1 | 1/2009 | Park et al. |
| 2009/0014412 A1 | 1/2009 | Nozawa et al. |
| 2009/0017192 A1 | 1/2009 | Matsuura |
| 2009/0027767 A1 | 1/2009 | Souriau et al. |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1 | 7/2009 | Kim et al. |
| 2009/0169868 A1 | 7/2009 | Haglund, Jr. et al. |
| 2009/0170230 A1 | 7/2009 | Kidu et al. |
| 2009/0181163 A1 | 7/2009 | Uetake |
| 2009/0208754 A1 | 8/2009 | Chu et al. |
| 2009/0220691 A1 | 9/2009 | Kim |
| 2009/0229524 A1* | 9/2009 | Kim et al. .................... 118/726 |
| 2009/0230850 A1 | 9/2009 | Nakayama et al. |
| 2009/0232976 A1 | 9/2009 | Yoon et al. |
| 2009/0269881 A1 | 10/2009 | Furuta et al. |
| 2009/0277386 A1 | 11/2009 | Takagi et al. |
| 2009/0302750 A1 | 12/2009 | Jun et al. |
| 2009/0304906 A1 | 12/2009 | Suduo et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0000854 A1 | 1/2010 | Goto et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0089443 A1 | 4/2010 | Bloomstein et al. |
| 2010/0090594 A1 | 4/2010 | Choi et al. |
| 2010/0130020 A1 | 5/2010 | Kim et al. |
| 2010/0156279 A1 | 6/2010 | Tamura et al. |
| 2010/0165454 A1 | 7/2010 | Suetsugu et al. |
| 2010/0170439 A1 | 7/2010 | Negishi |
| 2010/0192856 A1 | 8/2010 | Sung et al. |
| 2010/0196607 A1 | 8/2010 | Carlson et al. |
| 2010/0248416 A1 | 9/2010 | Priddy et al. |
| 2010/0255198 A1 | 10/2010 | Cleary et al. |
| 2010/0271602 A1 | 10/2010 | Hanazaki |
| 2010/0275842 A1 | 11/2010 | Park et al. |
| 2010/0297348 A1* | 11/2010 | Lee ........................ C23C 14/24 427/248.1 |
| 2010/0297349 A1 | 11/2010 | Lee et al. |
| 2010/0310768 A1 | 12/2010 | Lee et al. |
| 2010/0316801 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0042659 A1 | 2/2011 | Kim et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1* | 3/2011 | Ryu et al. ........................ 438/34 |
| 2011/0068331 A1 | 3/2011 | Koh et al. |
| 2011/0123707 A1 | 5/2011 | Lee et al. |
| 2011/0139069 A1 | 6/2011 | Ahn et al. |
| 2011/0165327 A1 | 7/2011 | Park et al. |
| 2011/0168986 A1 | 7/2011 | Lee et al. |
| 2011/0220019 A1 | 9/2011 | Lee et al. |
| 2011/0220022 A1 | 9/2011 | Hong et al. |
| 2011/0241438 A1 | 10/2011 | Kim et al. |
| 2011/0262625 A1 | 10/2011 | Park et al. |
| 2011/0266944 A1 | 11/2011 | Song et al. |
| 2012/0006259 A1 | 1/2012 | Sung et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0028390 A1 | 2/2012 | Lee et al. |
| 2012/0068199 A1 | 3/2012 | Sung et al. |
| 2012/0068201 A1 | 3/2012 | Sung et al. |
| 2012/0070928 A1 | 3/2012 | Kim et al. |
| 2012/0083061 A1 | 4/2012 | Kang et al. |
| 2012/0097992 A1 | 4/2012 | Jeong |
| 2012/0100282 A1 | 4/2012 | Lee et al. |
| 2012/0103253 A1 | 5/2012 | Park et al. |
| 2012/0132137 A1 | 5/2012 | Oh et al. |
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0183676 A1 | 7/2012 | Sonoda et al. |
| 2012/0214263 A1 | 8/2012 | Yamazaki et al. |
| 2012/0299016 A1 | 11/2012 | Choi |
| 2012/0299023 A1 | 11/2012 | Lee et al. |
| 2012/0299024 A1 | 11/2012 | Lee et al. |
| 2012/0301614 A1 | 11/2012 | Choi et al. |
| 2012/0301986 A1 | 11/2012 | Choi et al. |
| 2012/0313251 A1 | 12/2012 | Kato |
| 2013/0001528 A1 | 1/2013 | Chang et al. |
| 2013/0008379 A1 | 1/2013 | Chang et al. |
| 2013/0032829 A1 | 2/2013 | Sung et al. |
| 2013/0157016 A1 | 6/2013 | Kim |
| 2013/0217164 A1 | 8/2013 | Kang et al. |
| 2013/0291796 A1 | 11/2013 | Inoue et al. |
| 2013/0298829 A1 | 11/2013 | Jo et al. |

(56) References Cited

U.S. PATENT DOCUMENTS

| | | |
|---|---|---|
| 2013/0341598 A1 | 12/2013 | Chang et al. |
| 2014/0010957 A1 | 1/2014 | Inoue et al. |
| 2014/0014917 A1 | 1/2014 | Lee et al. |
| 2014/0014918 A1 | 1/2014 | Han |
| 2014/0014920 A1 | 1/2014 | Lee |
| 2014/0014921 A1 | 1/2014 | Choi |
| 2014/0014924 A1 | 1/2014 | Oh et al. |
| 2014/0014929 A1 | 1/2014 | Lee et al. |
| 2014/0034917 A1 | 2/2014 | Lee et al. |
| 2014/0045343 A1 | 2/2014 | Choi et al. |
| 2014/0077168 A1 | 3/2014 | Kim |
| 2014/0084262 A1 | 3/2014 | Kim |
| 2014/0084263 A1 | 3/2014 | Jin et al. |
| 2014/0110680 A1 | 4/2014 | Choe |
| 2014/0131667 A1 | 5/2014 | Chang |

FOREIGN PATENT DOCUMENTS

| | | |
|---|---|---|
| CN | 1489419 A | 4/2004 |
| CN | 1500904 A | 6/2004 |
| CN | 1556872 A | 12/2004 |
| CN | 1607868 A | 4/2005 |
| CN | 1682569 A | 10/2005 |
| CN | 1704501 A | 12/2005 |
| CN | 1716102 A | 1/2006 |
| CN | 1814854 A | 8/2006 |
| CN | 1841696 A | 10/2006 |
| EP | 1 413 644 | 4/2004 |
| EP | 1 418 250 A2 | 5/2004 |
| EP | 1 518 940 | 3/2005 |
| EP | 2354270 A1 | 8/2011 |
| JP | 57-194252 A2 | 11/1982 |
| JP | 2-247372 | 10/1990 |
| JP | 4-272170 | 9/1992 |
| JP | 5-22405 U1 | 3/1993 |
| JP | 5-98425 A2 | 4/1993 |
| JP | 5-230628 A2 | 9/1993 |
| JP | 6-326295 | 11/1994 |
| JP | 8-27568 A2 | 1/1996 |
| JP | 09-095776 | 4/1997 |
| JP | 10-050478 | 2/1998 |
| JP | 10-120171 | 5/1998 |
| JP | 10-270535 | 10/1998 |
| JP | 11-144865 | 5/1999 |
| JP | 2000-68054 | 3/2000 |
| JP | 2000-282219 | 10/2000 |
| JP | 2000-323277 | 11/2000 |
| JP | 2001-28325 A2 | 1/2001 |
| JP | 2001-52862 | 2/2001 |
| JP | 2001-93667 | 4/2001 |
| JP | 2002-75638 A2 | 3/2002 |
| JP | 2002-175878 | 6/2002 |
| JP | 2002-348659 | 12/2002 |
| JP | 2003-3250 | 1/2003 |
| JP | 2003-77662 | 3/2003 |
| JP | 2003-157973 | 5/2003 |
| JP | 2003-197531 A2 | 7/2003 |
| JP | 2003-297562 | 10/2003 |
| JP | 2003-321767 A2 | 11/2003 |
| JP | 2003-347394 A2 | 12/2003 |
| JP | 2004-035964 A2 | 2/2004 |
| JP | 2004-43898 | 2/2004 |
| JP | 2004-076150 | 3/2004 |
| JP | 2004-91858 A2 | 3/2004 |
| JP | 2004-103269 | 4/2004 |
| JP | 2004-103341 | 4/2004 |
| JP | 2004-107764 A2 | 4/2004 |
| JP | 2004-137583 | 5/2004 |
| JP | 2004-143521 | 5/2004 |
| JP | 2004-169169 A2 | 6/2004 |
| JP | 2004-199919 | 7/2004 |
| JP | 2004-225058 | 8/2004 |
| JP | 2004-342455 A2 | 12/2004 |
| JP | 2004-349101 | 12/2004 |
| JP | 2004-355975 | 12/2004 |
| JP | 2005-44592 | 2/2005 |
| JP | 2005-101505 | 4/2005 |
| JP | 2005-122980 A2 | 5/2005 |
| JP | 2005-163099 | 6/2005 |
| JP | 2005-165015 A2 | 6/2005 |
| JP | 2005-174843 A2 | 6/2005 |
| JP | 2005-206939 A2 | 8/2005 |
| JP | 2005-213616 A2 | 8/2005 |
| JP | 2005-235568 | 9/2005 |
| JP | 2005-293968 | 10/2005 |
| JP | 2005-296737 | 10/2005 |
| JP | 2006-28583 A2 | 2/2006 |
| JP | 2006-172930 A2 | 6/2006 |
| JP | 2006-176809 A2 | 7/2006 |
| JP | 2006-210038 A2 | 8/2006 |
| JP | 2006-219760 | 8/2006 |
| JP | 2006-275433 | 10/2006 |
| JP | 2006-292955 A2 | 10/2006 |
| JP | 2006-307247 A2 | 11/2006 |
| JP | 2006-324649 A | 11/2006 |
| JP | 2007-47293 | 2/2007 |
| JP | 2007-66862 | 3/2007 |
| JP | 2007-146219 | 6/2007 |
| JP | 2007-157886 | 6/2007 |
| JP | 2007-186740 A2 | 7/2007 |
| JP | 2007-242436 | 9/2007 |
| JP | 2007-291506 A2 | 11/2007 |
| JP | 2008-19477 A2 | 1/2008 |
| JP | 2008-108628 A2 | 5/2008 |
| JP | 2008-121098 | 5/2008 |
| JP | 2008-521165 A2 | 6/2008 |
| JP | 2008-156686 | 7/2008 |
| JP | 2008-196003 | 8/2008 |
| JP | 2008-248301 A2 | 10/2008 |
| JP | 2008-274373 | 11/2008 |
| JP | 2008-288201 A | 11/2008 |
| JP | 2008-300056 | 12/2008 |
| JP | 2009-19243 | 1/2009 |
| JP | 2009-24208 A2 | 2/2009 |
| JP | 2009-049223 | 3/2009 |
| JP | 2009-81165 A2 | 4/2009 |
| JP | 2009-87910 | 4/2009 |
| JP | 2009-117231 A2 | 5/2009 |
| JP | 2009-520110 | 5/2009 |
| JP | 2010-159167 A2 | 7/2010 |
| JP | 2010-261081 A2 | 11/2010 |
| JP | 2011-47035 | 3/2011 |
| JP | 2011-146377 | 7/2011 |
| JP | 2012-92448 | 5/2012 |
| JP | 2012-211352 | 11/2012 |
| KR | 1997-0008709 A | 2/1997 |
| KR | 10-0257219 | 2/2000 |
| KR | 10-2000-0019254 | 4/2000 |
| KR | 10-2000-0023929 | 5/2000 |
| KR | 2001-0024652 A | 3/2001 |
| KR | 2001-0030175 A | 4/2001 |
| KR | 10-2001-0039298 A | 5/2001 |
| KR | 10-2001-0059939 | 7/2001 |
| KR | 10-2001-0092914 A | 10/2001 |
| KR | 2001-0093666 A | 10/2001 |
| KR | 20-0257218 Y1 | 12/2001 |
| KR | 10-2002-0000201 | 1/2002 |
| KR | 10-2002-0001555 | 1/2002 |
| KR | 2002-0025760 | 4/2002 |
| KR | 10-2002-0050922 | 6/2002 |
| KR | 2002-0088662 A | 11/2002 |
| KR | 10-2002-0090934 | 12/2002 |
| KR | 10-2002-0091457 A | 12/2002 |
| KR | 2003-0001745 A | 1/2003 |
| KR | 2003-0034730 A | 5/2003 |
| KR | 10-2003-0043012 A | 6/2003 |
| KR | 2003-0046090 A | 6/2003 |
| KR | 2003-0069684 A | 8/2003 |
| KR | 10-0405080 | 10/2003 |
| KR | 10-0406059 B1 | 11/2003 |
| KR | 10-2003-0091947 | 12/2003 |
| KR | 10-2003-0093959 | 12/2003 |
| KR | 2003-0094033 A | 12/2003 |
| KR | 10-2004-0014258 A | 2/2004 |

(56) References Cited

FOREIGN PATENT DOCUMENTS

| | | |
|---|---|---|
| KR | 20-0342433 Y1 | 2/2004 |
| KR | 10-2004-0034537 | 4/2004 |
| KR | 10-2004-0039910 A | 5/2004 |
| KR | 10-0430336 B1 | 5/2004 |
| KR | 10-2004-0050045 | 6/2004 |
| KR | 10-2004-0069281 | 8/2004 |
| KR | 10-2004-0084747 | 10/2004 |
| KR | 10-2004-0087142 A | 10/2004 |
| KR | 10-2004-0110718 A | 12/2004 |
| KR | 10-0463212 | 12/2004 |
| KR | 10-2005-0018234 A | 2/2005 |
| KR | 10-2005-0024324 A | 3/2005 |
| KR | 10-2005-0028943 | 3/2005 |
| KR | 10-2005-0039140 A | 4/2005 |
| KR | 10-0483487 B1 | 4/2005 |
| KR | 10-2005-0062853 A | 6/2005 |
| KR | 10-2005-0082644 A | 8/2005 |
| KR | 10-0520159 | 9/2005 |
| KR | 10-0532657 B1 | 12/2005 |
| KR | 10-2006-0008602 | 1/2006 |
| KR | 10-2006-0018745 | 3/2006 |
| KR | 10-2006-0020050 A | 3/2006 |
| KR | 10-2006-0045225 A | 5/2006 |
| KR | 10-2006-0049050 A | 5/2006 |
| KR | 10-2006-0051746 A | 5/2006 |
| KR | 10-2006-0053926 A | 5/2006 |
| KR | 10-2006-0056706 A | 5/2006 |
| KR | 10-2006-0058459 A | 5/2006 |
| KR | 10-2009-0052828 A | 5/2006 |
| KR | 10-2006-0059068 A | 6/2006 |
| KR | 10-2006-0059323 A | 6/2006 |
| KR | 10-2006-0060994 | 6/2006 |
| KR | 10-2006-0065978 A | 6/2006 |
| KR | 10-2006-0073367 | 6/2006 |
| KR | 10-2006-0077887 A | 7/2006 |
| KR | 10-2006-0080475 | 7/2006 |
| KR | 10-2006-0080481 | 7/2006 |
| KR | 10-2006-0080482 | 7/2006 |
| KR | 10-2006-0081943 A | 7/2006 |
| KR | 10-2006-0083510 | 7/2006 |
| KR | 10-2006-0092387 A | 8/2006 |
| KR | 10-2006-0098755 A | 9/2006 |
| KR | 10-2006-0104288 A | 10/2006 |
| KR | 10-2006-0104675 | 10/2006 |
| KR | 10-2006-0104677 | 10/2006 |
| KR | 10-2006-0109561 A | 10/2006 |
| KR | 10-2006-0109627 | 10/2006 |
| KR | 10-0635903 B1 | 10/2006 |
| KR | 10-2006-0114462 A | 11/2006 |
| KR | 10-2006-0114477 A | 11/2006 |
| KR | 10-2006-0114573 A | 11/2006 |
| KR | 10-0645719 B1 | 11/2006 |
| KR | 10-0646160 | 11/2006 |
| KR | 10-2006-0123944 A | 12/2006 |
| KR | 10-0687007 | 2/2007 |
| KR | 10-2007-0025164 | 3/2007 |
| KR | 10-0696547 | 3/2007 |
| KR | 10-0696550 B1 | 3/2007 |
| KR | 10-0697663 B1 | 3/2007 |
| KR | 10-0698033 | 3/2007 |
| KR | 10-0700466 | 3/2007 |
| KR | 10-2007-0035796 | 4/2007 |
| KR | 10-2007-0037848 A | 4/2007 |
| KR | 10-0711885 | 4/2007 |
| KR | 10-2007-0050793 | 5/2007 |
| KR | 10-0723627 | 5/2007 |
| KR | 10-2007-0056190 A | 6/2007 |
| KR | 10-0726132 | 6/2007 |
| KR | 10-0736218 B1 | 7/2007 |
| KR | 10-0741142 B1 | 7/2007 |
| KR | 10-2007-0078713 | 8/2007 |
| KR | 10-2007-0080635 | 8/2007 |
| KR | 10-2007-0091437 A | 9/2007 |
| KR | 10-2006-0028115 | 10/2007 |
| KR | 10-2007-0097218 | 10/2007 |
| KR | 10-2007-0098122 A | 10/2007 |
| KR | 10-2007-0101842 | 10/2007 |
| KR | 10-2007-0105595 | 10/2007 |
| KR | 10-0768212 B1 | 10/2007 |
| KR | 10-0770653 | 10/2007 |
| KR | 10-2007-0112668 A | 11/2007 |
| KR | 10-2007-0114094 A | 11/2007 |
| KR | 10-0739309 B1 | 12/2007 |
| KR | 10-0787457 B1 | 12/2007 |
| KR | 10-2008-0001184 | 1/2008 |
| KR | 10-2008-0003720 A | 1/2008 |
| KR | 10-2008-0007896 A | 1/2008 |
| KR | 10-2008-0009285 A | 1/2008 |
| KR | 10-0797787 | 1/2008 |
| KR | 10-0800125 | 1/2008 |
| KR | 10-0815265 | 3/2008 |
| KR | 10-2008-0036983 A | 4/2008 |
| KR | 10-0823508 | 4/2008 |
| KR | 10-0823511 B1 | 4/2008 |
| KR | 10-0827760 | 4/2008 |
| KR | 10-2008-0044239 A | 5/2008 |
| KR | 10-2008-0044775 A | 5/2008 |
| KR | 10-2008-0046761 A | 5/2008 |
| KR | 10-2008-0048653 | 6/2008 |
| KR | 10-2008-0055124 A | 6/2008 |
| KR | 10-2008-0057159 A | 6/2008 |
| KR | 10-0839380 | 6/2008 |
| KR | 10-2008-0060400 | 7/2008 |
| KR | 10-2008-0061132 | 7/2008 |
| KR | 10-2008-0061666 A | 7/2008 |
| KR | 10-2008-0061774 A | 7/2008 |
| KR | 10-2008-0062212 | 7/2008 |
| KR | 10-0899279 B1 | 7/2008 |
| KR | 10-2008-0076574 A | 8/2008 |
| KR | 10-2008-0088737 A | 10/2008 |
| KR | 10-2008-0104479 A | 12/2008 |
| KR | 10-2008-0104695 A | 12/2008 |
| KR | 10-2008-0109559 A | 12/2008 |
| KR | 10-2009-0017910 A | 2/2009 |
| KR | 10-0889872 B1 | 3/2009 |
| KR | 10-2009-0038733 | 4/2009 |
| KR | 10-2009-0040618 A | 4/2009 |
| KR | 10-2009-0047953 A | 5/2009 |
| KR | 10-2009-0052155 A | 5/2009 |
| KR | 10-2009-0053417 A | 5/2009 |
| KR | 10-2009-0066996 A | 6/2009 |
| KR | 10-2009-0075887 A | 7/2009 |
| KR | 10-2009-0079765 | 7/2009 |
| KR | 10-2009-0081717 A | 7/2009 |
| KR | 10-0908232 B1 | 7/2009 |
| KR | 10-2009-0093161 A | 9/2009 |
| KR | 10-2009-0094911 A | 9/2009 |
| KR | 10-2009-0097453 | 9/2009 |
| KR | 10-2009-0098186 | 9/2009 |
| KR | 10-2009-0107702 | 10/2009 |
| KR | 10-2010-0000128 A | 1/2010 |
| KR | 10-2010-0000129 A | 1/2010 |
| KR | 10-2010-0002381 | 1/2010 |
| KR | 10-2010-0026655 A | 3/2010 |
| KR | 10-2010-0038088 A | 4/2010 |
| KR | 10-2010-0044606 A | 4/2010 |
| KR | 10-2010-0047796 | 5/2010 |
| KR | 10-0961110 B1 | 6/2010 |
| KR | 10-2010-0090070 A | 8/2010 |
| KR | 10-2010-0099806 A | 9/2010 |
| KR | 10-2010-0119368 A | 11/2010 |
| KR | 10-2010-0126125 A | 12/2010 |
| KR | 10-2010-0128589 A | 12/2010 |
| KR | 10-2010-0130786 A | 12/2010 |
| KR | 10-2010-0133678 A | 12/2010 |
| KR | 10-2010-0138139 A | 12/2010 |
| KR | 10-1017654 B1 | 2/2011 |
| KR | 10-2011-0021090 A | 3/2011 |
| KR | 10-2011-0022512 A | 3/2011 |
| KR | 10-2011-0032589 A | 3/2011 |
| KR | 10-2011-0082418 A | 7/2011 |
| KR | 10-2011-0101767 A | 9/2011 |
| KR | 10-2011-0110525 A | 10/2011 |
| KR | 10-2011-0120213 A | 11/2011 |

(56) References Cited

FOREIGN PATENT DOCUMENTS

| | | |
|---|---|---|
| KR | 10-2011-0138787 A | 12/2011 |
| KR | 10-2012-0006322 A | 1/2012 |
| KR | 10-2012-0006324 A | 1/2012 |
| KR | 10-2012-0012300 | 2/2012 |
| KR | 10-2012-0042155 A | 5/2012 |
| KR | 10-2012-0065789 A | 6/2012 |
| KR | 10-2012-0080855 A | 7/2012 |
| KR | 10-2012-0081811 A | 7/2012 |
| KR | 10-1193186 B1 | 10/2012 |
| KR | 10-2012-0131545 A | 12/2012 |
| KR | 10-2013-0007308 A | 1/2013 |
| WO | 9925894 A1 | 5/1999 |
| WO | 03043067 A1 | 5/2003 |
| WO | WO2004016406 A1 | 2/2004 |
| WO | 2008004792 A1 | 1/2008 |

OTHER PUBLICATIONS

JPO Office action dated Jan. 8, 2013 for Japanese Patent Application No. 2011-000180 (3 pages).
English-language abstract of Korean Publication No. KR 10-2002-0034272.
English-language abstract of Korean Publication No. KR 10-2002-0056238.
English-language abstract of Korean Publication No. KR 10-2002-0088662.
English-language abstract of Korean Publication No. KR 10-2005-0045619.
English-language abstract of Korean Publication No. KR 10-2006-0126267.
English-language abstract of Korean Publication No. KR 10-2008-0038650.
U.S. Appl. No. 12/784,774, filed May 21, 2010, Choong-Ho Lee et al., Samsung Mobile Display Co., Ltd.
U.S. Appl. No. 13/014,225, filed Jan. 26, 2011, Jong-Won Hong et al., Samsung Mobile Display Co., Ltd.
U.S. Appl. No. 12/797,858, filed Jun. 10, 2010, Choong-Ho Lee et al., Samsung Mobile Display Co., Ltd.
U.S. Appl. No. 12/836,760, filed Jul. 15, 2010, Jong-Heon Kim, et al., Samsung Mobile Display Co., Ltd.
U.S. Appl. No. 12/784,804, filed May 21, 2010, Choong-Ho Lee, et al., Samsung Mobile Display Co., Ltd.
U.S. Appl. No. 12/849,193, filed Aug. 3, 2010, Ji-Sook Oh et al., Samsung Mobile Display Co., Ltd.
U.S. Appl. No. 12/820,355, filed Jun. 22, 2010, Yong-Sup Choi et al., Samsung Mobile Display Co., Ltd.
U.S. Appl. No. 12/950,361, filed Nov. 19, 2010, Choong-Ho Lee, et al., Samsung Mobile Display Co., Ltd.
U.S. Appl. No. 12/795,896, filed Jun. 8, 2010, Jung-Min Lee, et al., Samsung Mobile Display Co., Ltd.
U.S. Appl. No. 12/856,942, filed Aug. 16, 2010, Yun-Mi Lee et al., Samsung Mobile Display Co., Ltd.
U.S. Appl. No. 12/814,816, filed Jun. 14, 2010, Jung-Min Lee et al., Samsung Mobile Display Co., Ltd.
U.S. Appl. No. 12/868,099, filed Aug. 25, 2010, Hee-Cheol Kang, et al., Samsung Mobile Display Co., Ltd.
U.S. Appl. No. 12/862,153, filed Aug. 24, 2010, Hee-Cheol Kang, et al., Samsung Mobile Display Co., Ltd.
U.S. Appl. No. 12/869,830, filed Aug. 27, 2010, Chang-Mog Jo, et al., Samsung Mobile Display Co., Ltd.
U.S. Appl. No. 12/849,092, filed Aug. 3, 2010, Choong-Ho Lee et al., Samsung Mobile Display Co., Ltd.
U.S. Appl. No. 12/873,556, filed Sep. 1, 2010, Young-Mook Choi, et al., Samsung Mobile Display Co., Ltd.
U.S. Appl. No. 12/873,689, filed Sep. 1, 2010, Young-Mook Choi, et al., Samsung Mobile Display Co., Ltd.
U.S. Appl. No. 12/815,673, filed Jun. 15, 2010, Jung-Min Lee, Samsung Mobile Display Co., Ltd.
U.S. Appl. No. 12/794,093, filed Jun. 4, 2010, Jung-Min Lee et al., Samsung Mobile Display Co., Ltd.
U.S. Appl. No. 12/862,125, filed Aug. 24, 2010, Jae-Kwang Ryu et al., Samsung Mobile Display Co., Ltd.
U.S. Appl. No. 12/795,001, filed Jun. 7, 2010, Choong-Ho Lee et al., Samsung Mobile Display Co., Ltd.
U.S. Appl. No. 12/813,786, filed Jun. 11, 2010, Choong-Ho Lee et al., Samsung Mobile Display Co., Ltd.
U.S. Appl. No. 12/820,270, filed Jun. 22, 2010, Jung-Min Lee et al., Samsung Mobile Display Co., Ltd.
U.S. Appl. No. 12/907,396, filed Oct. 19, 2010, Yong-Sup Choi, et al., Samsung Mobile Display Co., Ltd.
U.S. Appl. No. 12/987,569, filed Jan. 10, 2011, Yun-Mi Lee et al., Samsung Mobile Display Co., Ltd.
U.S. Appl. No. 12/984,289, filed Jan. 4, 2011, Jung-Yeong Kim et al., Samsung Mobile Display Co., Ltd.
U.S. Appl. No. 13/031,756, filed Feb. 22, 2011, Yong Sup Choi et al., Samsung Mobile Display Co., Ltd.
Japanese Office action dated Jan. 22, 2013, for Japanese Patent application 2010-116470, (3pages).
JPO Office action dated Mar. 19, 2013, for Japanese Patent application 2011-097909, (3 pages).
U.S. Office action dated Mar. 23, 2012, for cross reference U.S. Appl. No. 12/849,193, 17 pages.
European Search Report dated May 13, 2011, for corresponding European Patent application 11250019.4, noting Category X reference EP 1 413 644, previously submitted in an IDS dated Feb. 17, 2011, 6 pages.
European Search Report dated May 20, 2011, for European Patent application 10251404.9, noting Category X reference 2005/0263074, listed in this IDS, 12 pages.
European Search Report dated Sep. 6, 2010, for European Patent application 10250962.7, 5 pages.
KIPO Office action dated Jul. 1, 2011 for corresponding Korean Patent application 10-2009-0072111, 4 pages.
KIPO Office action dated Jun. 1, 2011 for corresponding Korean Patent application 10-2009-0050528, 4 pages.
SIPO Office action dated Nov. 28, 2012, for corresponding Chinese Patent application 201110029291.3, (11 pages).
KIPO Registration Determination Certificate dated Oct. 27, 2011, for Korean priority Patent application 10-2010-0002381, 5 pages.
U.S. Office action dated Dec. 13, 2011, for cross-reference U.S. Appl. No. 12/849,193, 30 pages.
KIPO Registration Determination Certificate dated Sep. 23, 2011, for Korean priority Patent application 10-2009-0055473, corresponding to cross reference U.S. Appl. No. 12/784,804, 5 pages.
KIPO Registration Determination Certificate dated Sep. 28, 2011, for Korean priority Patent application 10-2009-0052359, corresponding to cross reference U.S. Appl. No. 12/784,804, 5 pages.
KIPO Registration Determination Certificate dated Sep. 28, 2011, for Korean priority Patent application 10-2009-0045200, corresponding to cross reference U.S. Appl. No. 12/784,804, 5 pages.
KIPO Registration Determination Certificate dated Sep. 28, 2011, for Korean priority Patent application 10-2009-0045201, corresponding to cross reference U.S. Appl. No. 12/784,804, 5 pages.
SIPO Certificate of Patent dated Jul. 31, 2013, corresponding to Chinese Patent application 201110029291.3, (31 pages).
U.S. Office action dated Aug. 8, 2013, for cross reference U.S. Appl. No. 13/093,707, (7 pages).
SIPO Office action dated May 29, 2013, for Chinese Patent application 201010189614.0, (12 pages).
U.S. Notice of Allowance dated Jun. 30, 2014, issued to U.S. Appl. No. 12/907,396 (40 pages).
U.S. Office action dated Jun. 17, 2014, issued to U.S. Appl. No. 13/157,220 (36 pages).
European Search Report dated May 27, 2011 for European Application No. 10251514.5 (11 pages).
JP Office action dated Aug. 21, 2012, issued to JP Application No. 2010-145075 (5 pages).
JP Office action dated Sep. 4, 2012, issued to JP Application No. 2010-152846 (4 pages).
JPO Office action dated Apr. 1, 2014, for Japanese Patent application 2010-286245 (4 pages).

(56) References Cited

OTHER PUBLICATIONS

JPO Office action dated Feb. 25, 2014, for corresponding Japanese Patent application 2013-128405 (3 pages).
JPO Office action dated Jan. 28, 2014, for corresponding Japanese Patent application 2011-097909 (4 pages).
KIPO Notice of Allowance dated Apr. 26, 2012 for Korean Application No. 10-2010-0066991 (5 pages).
KIPO Notice of Allowance dated Apr. 30, 2012, issued to KR 10-2010-0066992 (5 pages).
KIPO Notice of Allowance dated Aug. 24, 2012, issued to KR 10-2010-0066993 (5 pages).
KIPO Notice of Allowance dated Jul. 20, 2012, issued to KR 10-2010-0003545 (5 pages).
KIPO Notice of Allowance dated Oct. 31, 2011, for Korean Patent application 10-2010-0014273, ( 5 pages).
KIPO Notice of Allowance dated Sep. 1, 2012, for Korean Patent application 10-2010-0013847 (5 pages).
KIPO Notice of Allowance dated Sep. 1, 2012, issued to KR 10-2010-0009160 (5 pages).
KIPO Notice of Allowance dated Sep. 1, 2012, issued to KR 10-2010-0013848 (5 pages).
KIPO Notice of Allowance, dated Nov. 25, 2011, issued to KR 10-2010-0014277 (5 pages).
KIPO Notice of Allowance, dated Sep. 1, 2012, issued to KR 10-2010-0014276 (5 pages).
KIPO Notice of Allowance, dated Sep. 28, 2011, issued to KR 10-2009-0052357 (5 pages).
KIPO Office action dated Apr. 2, 2012, issued to KR 10-2010-0066993 (4 pages).
KIPO Office action dated Apr. 4, 2012, issued in KR Application No. 10-2009-0112796 (5 pages).
KIPO Office Action dated Apr. 9, 2012 for Korean Application No. 10-2010-0031556 (4 pages).
KIPO Office action dated Aug. 1, 2011, issued to KR 10-2009-0074001 (3 pages).
KIPO Office Action dated Aug. 28, 2012, issued to KR 10-2010-0014274 (5 pages).
KIPO Office action dated Feb. 1, 2012, for Korean Patent application 10-2010-0013847 (5 pages).
KIPO Office action dated Feb. 1, 2012, issued to KR 10-2010-0011196 (4 pages).
KIPO Office action dated Feb. 1, 2012, issued to KR 10-2010-0013848 (4 pages).
KIPO Office action dated Feb. 1, 2012, issued to KR 10-2010-0014272 (4 pages).
KIPO Office Action dated Feb. 6, 2012 for Korean Application No. 10-2010-0011480 (8 pages).
KIPO Office Action dated Feb. 6, 2012 for Korean Application No. 10-2010-0011481 (7 pages).
KIPO Office Action dated Feb. 6, 2012, issued to KR 10-2010-0014274 (9 pages).
KIPO Office Action dated Feb. 6, 2012, issued to KR 10-2010-0021835 (4 pages).
KIPO Office action dated Jan. 13, 2012, issued to KR 10-2009-0056529 (5 pages).
KIPO Office action dated Jan. 6, 2012, issued to KR Application No. 10-2010-0000897 (4 pages).
KIPO Office action dated Mar. 21, 2012, issued to KR Application No. 10-2010-0065465 (5 pages).
KIPO Office action dated Sep. 1, 2012, issued to KR 10-2010-0010136 (5 pages).
KIPO Registration Determination Certificate dated Jul. 2, 2012, for Korean Application No. 10-2010-0011480 (5 pages).
KIPO Registration Determination Certificate dated Jul. 2, 2012, for Korean Application No. 10-2010-0011481 (5 pages).
KIPO Registration Determination Certificate dated Nov. 30, 2011, for Korean application 10-2009-0056530 (5 pages).
KIPO Registration Determination Certificate, dated Jul. 20, 2012, issued to KR Application No. 10-2010-0000897 (5 pages).
SIPO Certificate of Patent dated Aug. 14, 2013, for Chinese application 201002664066 (36 pages).
SIPO Office action dated Dec. 17, 2013, for Chinese Patent application 201010216896.9 (6 pages).
SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated Oct. 9, 2012 for Chinese Application No. 201010266406.6 (6 pages).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated Feb. 20, 2014, issued to U.S. Appl. No. 12/907,396 (13 pages).
U.S. Notice of Allowance dated Feb. 28, 2014, issued to U.S. Appl. No. 13/279,077 (12 pages).
U.S. Notice of Allowance dated May 9, 2014 for U.S. Appl. No. 13/194,759 (27 pages).
U.S. Office action dated Apr. 1, 2013, issued to U.S. Appl. No. 12/784,774 (44 pages).
U.S. Office action dated Apr. 18, 2014, issued to U.S. Appl. No. 12/814,816 (9 pages).
U.S. Office action dated Apr. 29, 2013, issued to U.S. Appl. No. 12/820,355 (31 pages).
U.S. Office action dated Aug. 13, 2013, issued to U.S. Appl. No. 13/194,759, (28 pages).
U.S. Office Action dated Aug. 2, 2013 for U.S. Appl. No. 12/868,099 (32 pages).
U.S. Office action dated Aug. 21, 2013 issued in cross-reference U.S. Appl. No. 12/820,355 (14 pages).
U.S. Office action dated Aug. 7, 2013, issued to U.S. Appl. No. 13/015,357, (30 pages).
U.S. Office action dated Dec. 16, 2013 for U.S. Appl. No. 14/054,536 (35 pages).
U.S. Office action dated Dec. 17, 2012, issued to U.S. Appl. No. 12/873,556 (37 pages).
U.S. Office action dated Dec. 26, 2012, issued to U.S. Appl. No. 12/815,673 (21 pages).
U.S. Office action dated Feb. 11, 2014, for cross reference U.S. Appl. No. 13/178,472 (8 pages).
U.S. Office action dated Feb. 26, 2013, issued to U.S. Appl. No. 12/794,093 (31 pages).
U.S. Office action dated Feb. 6, 2014, for U.S. Appl. No. 12/984,231 (16 pages).
U.S. Office action dated Jan. 25, 2013, issued to U.S. Appl. No. 13/015,357 (21 pages).
U.S. Office action dated Jul. 11, 2013 for U.S. Appl. No. 13/461,669 (27 pages).
U.S. Office action dated Jul. 17, 2013, issued to U.S. Appl. No. 12/984,231, (18 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office action dated Jun. 11, 2013, issued to U.S. Appl. No. 12/862,125 (37 pages).
U.S. Office action dated Jun. 17, 2013, for cross reference U.S. Appl. No. 13/180,454, (23 pages).
U.S. Office Action dated Jun. 21, 2011 for U.S. Appl. No. 12/862,153 (21 pages).
U.S. Office action dated Jun. 26, 2013, issued to U.S. Appl. No. 12/794,093 (20 pages).
U.S. Office action dated Mar. 15, 2013, issued to U.S. Appl. No. 12/813,786 (33 pages).
U.S. Office action dated Mar. 17, 2014, for U.S. Appl. No. 12/950,361 (48 pages).

(56) References Cited

OTHER PUBLICATIONS

U.S. Office action dated Mar. 18, 2013, issued to U.S. Appl. No. 12/984,231 (29 pages).
U.S. Office action dated Mar. 19, 2013, issued to U.S. Appl. No. 13/194,759 (36 pages).
U.S. Office action dated Mar. 22, 2013, issued to U.S. Appl. No. 12/987,569 (12 pages).
U.S. Office action dated May 21, 2014, issued to U.S. Appl. No. 13/014,225 (15 pages).
U.S. Office action dated May 22, 2013, for cross reference U.S. Appl. No. 13/219,427, (26 pages).
U.S. Office action dated May 24, 2013, for U.S. Appl. No. 13/279,077 (20 pages).
U.S. Office action dated May 24, 2013, U.S. Appl. No. 12/849,092 (31 pages).
U.S. Office action dated May 6, 2014, issued to U.S. Appl. No. 13/467,998 (21 pages).
U.S. Office Action dated May 7, 2013, issued in U.S. Appl. No. 12/820,270 (37 pages).
U.S. Office action dated Nov. 20, 2013, for cross reference U.S. Appl. No. 12/868,099, (14 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages).
U.S. Office action dated Oct. 1, 2013, issued to U.S. Appl. No. 12/849,092, (13 pages).
U.S. Office action dated Oct. 11, 2013, issued to U.S. Appl. No. 12/907,396, (44 pages).
U.S. Office action dated Oct. 21, 2013, issued to U.S. Appl. No. 12/987,569, (14 pages).
U.S. Office Action dated Oct. 3, 2013 for U.S. Appl. No. 12/869,830 (28 pages).
U.S. Office action dated Oct. 7, 2013, issued to U.S. Appl. No. 13/279,077, (29 pages).
U.S. Office action dated Sep. 20, 2013, issued to U.S. Appl. No. 13/014,225, (33 pages).
U.S. Office action dated Sep. 25, 2013, for U.S. Appl. No. 13/031,756, (34 pages).
U.S. Office action dated Sep. 27, 2013, issued to U.S. Appl. No. 12/814,816 (19 pages).
U.S. Patent Office Action dated May 16, 2013, issued to U.S. Appl. No. 13/235,337 (28 pages).
US Notice of Allowance, dated Mar. 18, 2013, issued to U.S. Appl. No. 12/795,001 (29 pages).
US Office action dated Dec. 20, 2012, issued to U.S. Appl. No. 12/984,289 (20pages).
US Office action dated Sep. 12, 2012, in U.S. Appl. No. 12/515,673 (26 pages).
U.S. Notice of Allowance dated Jun. 11, 2014, issued to U.S. Appl. No. 13/468,835 (62 pages).
U.S. Office action dated Dec. 13, 2013, issued to U.S. Appl. No. 13/180,454 (18 pages).
U.S. Office action dated Dec. 2, 2013, issued to U.S. Appl. No. 13/157,220 (33 pages).
JPO Office action dated Jan. 20, 2015 for corresponding Japanese Patent application 2011-118686 (5 pages).
SIPO Office action dated Apr. 3, 2015, corresponding to Chinese Patent application 2012008397.X, (7 pages).
SIPO Office action dated Feb. 2, 2015, for corresponding Chinese Patent application 201110199594.X (12 pages).
U.S. Notice of Allowance dated Oct. 28, 2014, issued to U.S. Appl. No. 13/014,225 (64 pages).
U.S. Notice of Allowance dated Oct. 29, 2015, for cross reference U.S. Appl. No. 13/157,220, (96 pages).
U.S. Office action dated Aug. 10, 2015, for cross reference U.S. Appl. No. 13/157,220, (146 pages).
U.S. Office action dated Dec. 2, 2015, or cross reference U.S. Appl. No. 13/176,701, (79 pages).
U.S. Office action dated Dec. 31, 2014 issued to U.S. Appl. No. 12/873,556, (72 pages).
U.S. Office action dated Dec. 31, 2014 issued to U.S. Appl. No. 13/469,029, (74 pages).
U.S. Office action dated Nov. 14, 2014, issued to U.S. Appl. No. 13/178,472 (10 pages).
U.S. Office action dated Sep. 26, 2014, issued to U.S. Appl. No. 12/868,099 (66 pages).
SIPO Granted Document dated Sep. 21, 2016, corresponding to Chinese Patent Application No. 20110381944.3 (33 pages).
U.S. Office Action dated Sep. 28, 2016 for U.S. Appl. No. 14/946,686 (9 sheets).
U.S. Office Action dated Oct. 6, 2016 for U.S. Appl. No. 15/145,689 (16 pages).
U.S. Office Action dated Mar. 13, 2017, issued in cross-reference U.S. Appl. No. 15/145,689 (25 pages).
U.S. Office Action dated Jul. 17, 2017, issued in cross-reference U.S. Appl. No. 15/145,689 (20 pages).
U.S. Office Action dated Sep. 1, 2017, issued in cross-reference U.S. Appl. No. 14/752,708 (22 pages).
U.S. Advisory Action dated Mar. 19, 2018, issued in U.S. Appl. No. 15/145,689 (4 pages).
U.S. Final Office Action dated Jan. 2, 2018, issued in U.S. Appl. No. 15/145,689 (18 pages).
U.S. Office Action dated Jun. 14, 2018, issued in U.S. Appl. No. 15/145,689 (18 pages).

\* cited by examiner

THIN FILM DEPOSITION APPARATUS

CROSS-REFERENCE TO RELATED APPLICATION

This application claims the benefit of Korean Patent Application No. 10-2010-0002381, filed Jan. 11, 2010 in the Korean Intellectual Property Office, the disclosure of which is incorporated herein by reference.

BACKGROUND

1. Field

Aspects of the invention relate to a thin film deposition apparatus that can be simply applied to produce large-sized display devices on a mass scale and that improves manufacturing yield.

2. Description of the Related Art

Organic light-emitting display devices have a larger viewing angle, better contrast characteristics, and a faster response rate than other display devices, and thus have drawn attention as a next-generation display device. Organic light-emitting display devices generally have a stacked structure including an anode, a cathode, and an emission layer interposed between the anode and the cathode. The devices display images in color when holes and electrons, injected respectively from the anode and the cathode, recombine in the emission layer and thus light is emitted. However, it is difficult to achieve high light-emission efficiency with such a structure. Thus, intermediate layers are optionally additionally interposed between the emission layer and each of the electrodes. Examples of the intermediate layers include an electron injection layer, an electron transport layer, a hole transport layer, a hole injection layer, etc.

Also, it is practically very difficult to form fine patterns in organic thin films, such as the emission layer and the intermediate layers. Thus, the red, green, and blue light-emission efficiency varies according to the organic thin films. For these reasons, it is not easy to form an organic thin film pattern on a large substrate, such as a mother glass having a size of 5 G or more, by using a conventional thin film deposition apparatus. Therefore, it is difficult to manufacture large organic light-emitting display devices having satisfactory driving voltage, current density, brightness, color purity, light-emission efficiency, life-span characteristics. As such, there is a demand for improvement in this regard.

An organic light-emitting display device includes interlayers, including an emission layer, disposed between a first electrode and a second electrode that are arranged opposite to each other. The interlayers and the first and second electrodes may be formed using a variety of methods, such as using a deposition method. When an organic light-emitting display device is manufactured by using the deposition method, a fine metal mask (FMM) having the same pattern as a thin film to be formed is disposed to closely contact a substrate, and a thin film material is deposited over the FMM in order to form the thin film having the desired pattern.

SUMMARY

Aspects of the present invention provide a thin film deposition apparatus that may be easily manufactured, that may be simply applied to produce large-sized display devices on a mass scale, that improves manufacturing yield and deposition efficiency.

According to an aspect of the present invention, there is provided a thin film deposition apparatus for forming a thin film on a substrate, the apparatus including: a deposition source that discharges a deposition material; a deposition source nozzle unit disposed at a side of the deposition source and including a plurality of deposition source nozzles arranged in a first direction; and a patterning slit sheet disposed opposite to the deposition source nozzle unit and including a plurality of patterning slits arranged in a second direction that is perpendicular to the first direction, wherein a deposition is performed while the substrate or the thin film deposition apparatus moves relative to each other in the first direction, and the deposition source, the deposition source nozzle unit, and the patterning slit sheet are formed integrally with each other.

According to an aspect of the invention, the deposition source and the deposition source nozzle unit, and the patterning slit sheet may be connected to each other by a connection member.

According to an aspect of the invention, the connection member may guide movement of the discharged deposition material.

According to an aspect of the invention, the connection member may seal a space between the deposition source and the deposition source nozzle unit, and the patterning slit sheet from external air.

According to an aspect of the invention, the thin film deposition apparatus may be separated from the substrate by a predetermined distance.

According to an aspect of the invention, the deposition material discharged from the thin film deposition apparatus may be continuously deposited on the substrate while the substrate or the thin film deposition apparatus is moved relative to each other in the first direction.

According to an aspect of the invention, the patterning slit sheet of the thin film deposition apparatus may be smaller than the substrate.

According to an aspect of the invention, the thin film deposition apparatus may further include a correction plate disposed between the deposition source nozzle unit and the patterning slit sheet so as to block at least some of the deposition material discharged from the deposition source.

According to an aspect of the invention, the correction plate may be disposed so that the thin film formed on the substrate may have a constant thickness on the entire substrate.

According to an aspect of the invention, the correction plate may have a height that is gradually reduced as being apart from a center portion of the patterning slit sheet.

According to an aspect of the invention, the correction plate may be formed to have a circular arc shape or a cosine curve shape.

According to an aspect of the invention, the correction plate may be formed so as to block more deposition material at the center portion of the patterning slit sheet than the deposition material blocked on end portions of the patterning slit sheet.

According to an aspect of the invention, the plurality of patterning slits may be formed to have different lengths from each other.

According to an aspect of the invention, the plurality of patterning slits may be disposed so that the thin film formed on the substrate may have a constant thickness on the entire substrate.

According to an aspect of the invention, the amounts of the deposition materials deposited on the substrate may be controlled according to the lengths of the patterning slits.

According to an aspect of the invention, the patterning slit located at the center portion of the patterning slit sheet may have a length shorter than the lengths of the patterning slits located at the end portions of the patterning slit sheet.

According to an aspect of the invention, the plurality of deposition source nozzles may be tilted at a predetermined angle.

According to an aspect of the invention, the plurality of deposition source nozzles may include deposition source nozzles arranged in two rows formed in the first direction, and the deposition source nozzles in the two rows are tilted to face each other.

According to an aspect of the invention, the plurality of deposition source nozzles may include deposition source nozzles arranged in two rows formed in the first direction, the deposition source nozzles arranged in a row located at a first side of the patterning slit sheet are arranged to face a second side of the patterning slit sheet, and the deposition source nozzles arranged in the other row located at the second side of the patterning slit sheet are arranged to face the first side of the patterning slit sheet.

According to an aspect of the invention, the deposition source may include a first deposition source that discharges a host material and a second deposition source that is disposed at a side of the first deposition source and discharges a dopant material.

According to an aspect of the invention, at least a part of the host material discharged from the first deposition source and at least a part of the dopant material discharged from the second deposition source may be mixed with each other.

According to an aspect of the invention, the first deposition source and the second deposition source may be disposed in parallel with each other in the first direction.

According to an aspect of the invention, the deposition source nozzle unit may include a first deposition source nozzle unit disposed at a side of the first deposition source and including a plurality of deposition source nozzles arranged in the first direction, and a second deposition source nozzle unit disposed at a side of the second deposition source and including a plurality of deposition source nozzles arranged in the first direction.

According to an aspect of the invention, the plurality of deposition source nozzles in each of the first deposition nozzle unit and the second deposition nozzle unit may be tilted at a predetermined angle.

According to an aspect of the invention, the deposition source nozzles in the first deposition source nozzle unit and the deposition source nozzles in the second deposition source nozzle unit may be tilted to face each other.

According to an aspect of the invention, the deposition source nozzles of the first deposition source nozzle unit and the deposition source nozzles of the second deposition source nozzle unit may be tilted in such a manner that the host material and the dopant material are mixed in a constant mixture ratio throughout the entire substrate.

According to an aspect of the invention, the first deposition source and the second deposition source may be respectively formed as linear sources.

According to an aspect of the invention, the first deposition source may be formed as a linear source, and the second deposition source may be formed as one or more point sources.

According to an aspect of the invention, the first deposition source may be a plurality of point sources, and the second deposition source may be one or more point sources, and the plurality of point sources forming the first deposition source may form a revolver.

According to an aspect of the invention, the thin film deposition apparatus may include a plurality of thin film deposition assemblies, each including the thin film deposition source, the deposition source nozzle unit, and the patterning slit sheet.

According to another aspect of the present invention, there is provided a thin film deposition apparatus for forming a thin film on a substrate, the apparatus including: the thin film deposition apparatus comprises a plurality of thin film deposition assemblies, each of which includes: a deposition source that discharges a deposition material; a deposition source nozzle unit disposed at a side of the deposition source and including a plurality of deposition source nozzles arranged in a first direction; and a patterning slit sheet disposed opposite to the deposition source nozzle unit and including a plurality of patterning slits arranged in a second direction perpendicular to the first direction, wherein the substrate or the thin film deposition apparatus is moved relative to each other in the first direction to perform a deposition.

According to an aspect of the invention, the deposition source, the deposition source nozzle unit, and the patterning slit sheet in each of the thin film deposition assemblies may be formed integrally with each other.

According to an aspect of the invention, the deposition source and the deposition source nozzle unit, and the patterning slit sheet in each of the thin film deposition assemblies may be connected to each other by a connection member.

According to an aspect of the invention, the connection member may guide movement of the discharged deposition material.

According to an aspect of the invention, the connection member may seal a space between the deposition source and the deposition source nozzle unit, and the patterning slit sheet.

According to an aspect of the invention, the thin film deposition apparatus may be separated from the substrate by a predetermined distance.

According to an aspect of the invention, the deposition material discharged from the thin film deposition apparatus may be continuously deposited on the substrate while the substrate or the thin film deposition apparatus is moved relative to each other in the first direction.

According to an aspect of the invention, the patterning slit sheets of the plurality of thin film deposition assemblies may be smaller than the substrate.

According to an aspect of the invention, the deposition sources of the plurality of thin film deposition assemblies may respectively contain different deposition materials.

According to an aspect of the invention, the deposition materials respectively contained in the deposition sources of the plurality of thin film deposition assemblies may be simultaneously deposited on the substrate.

According to an aspect of the invention, the number of thin film deposition assemblies may be at least three, and deposition materials respectively contained in the deposition sources of the at least three thin film deposition assemblies may include materials for forming red, green and blue emission layers.

According to an aspect of the invention, the deposition temperatures of the deposition sources of the plurality of thin film deposition assemblies may be separately controllable.

According to an aspect of the invention, the deposition amounts of the deposition materials discharged from the deposition sources of the plurality of thin film deposition assemblies may be separately controllable.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become more apparent and more readily appreciated from the following description of the embodiments, taken in conjunction with the accompanying drawings of which.

DETAILED DESCRIPTION

Figure 1:
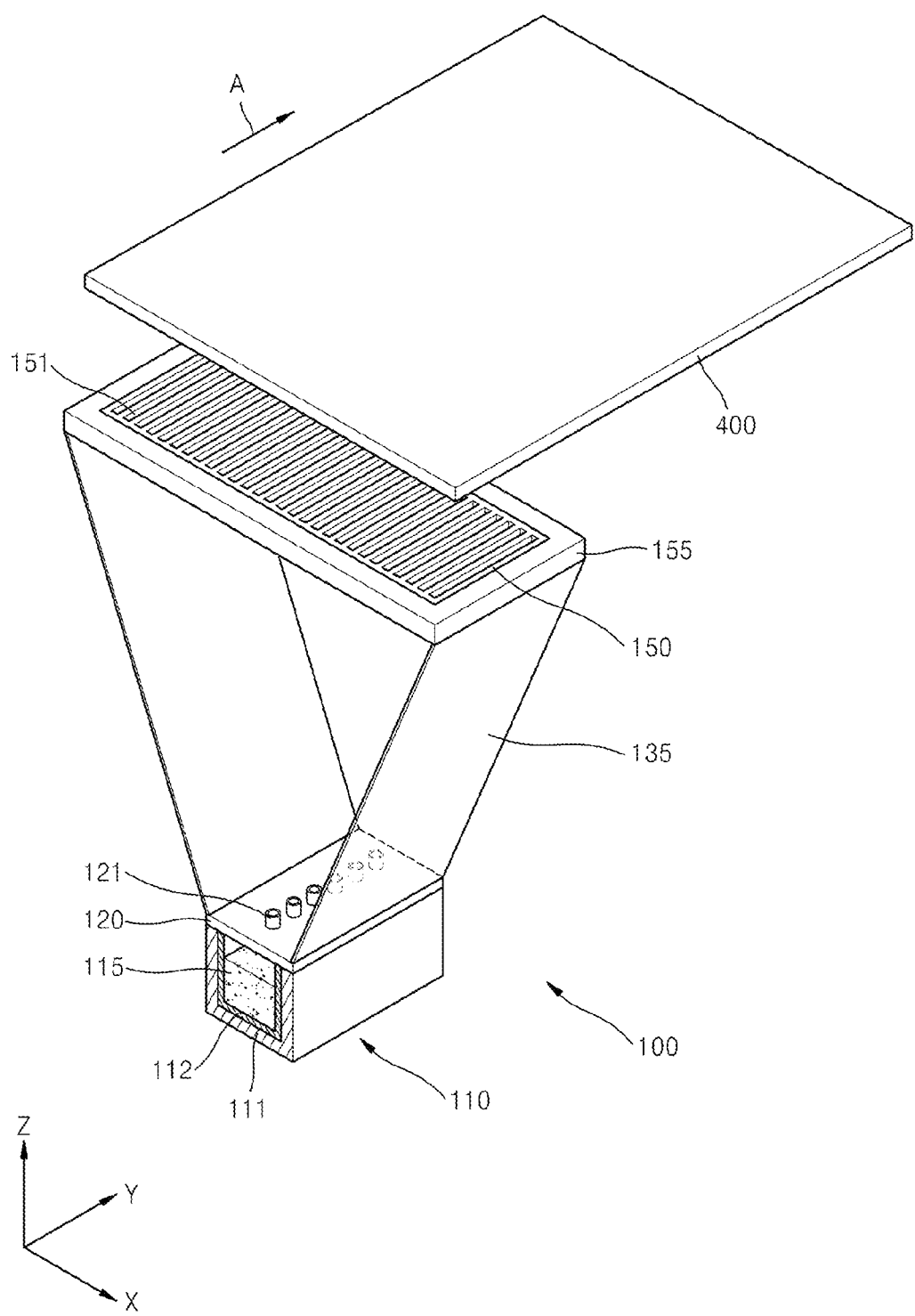
FIG. 1 is a schematic perspective view of a thin film deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
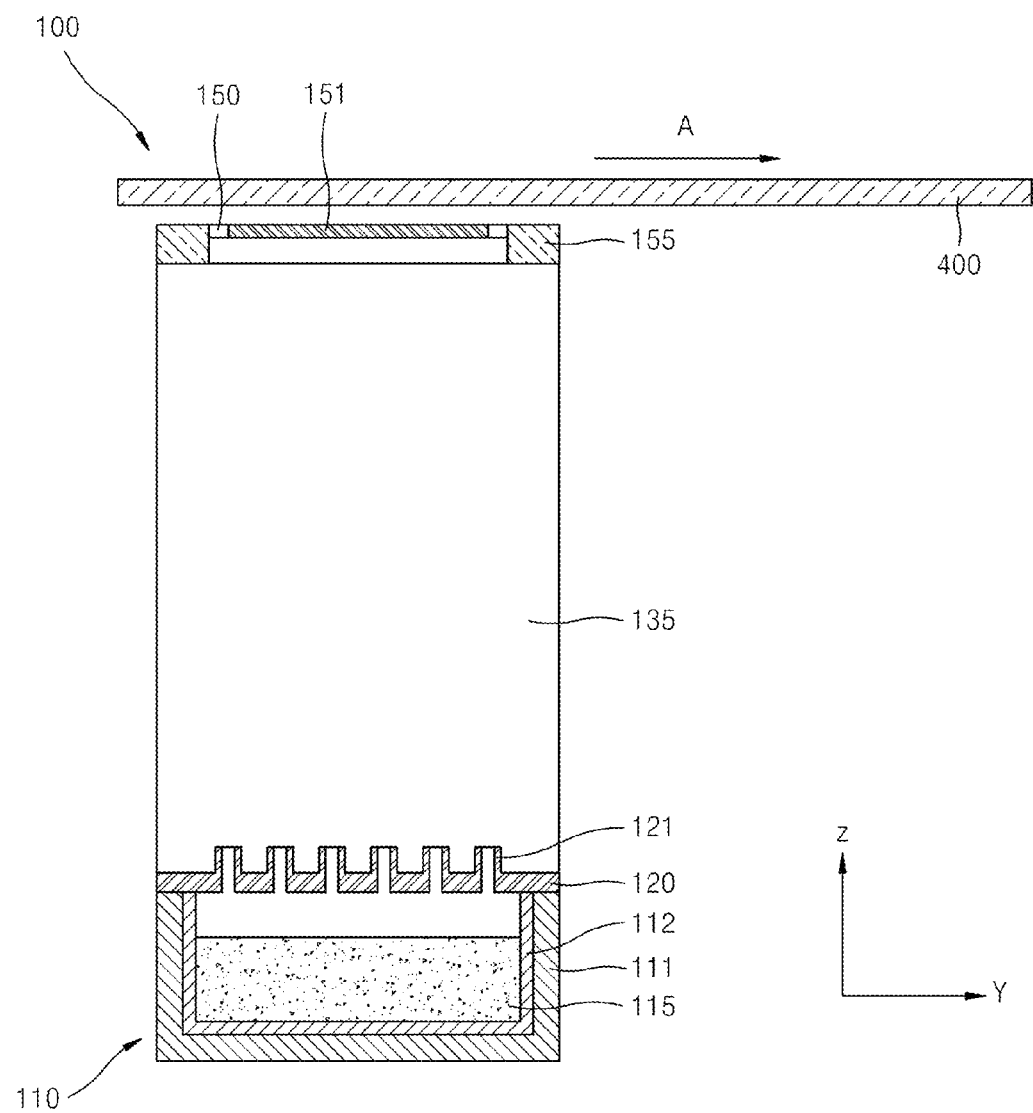
FIG. 2 is a schematic side view of the thin film deposition apparatus of FIG. 1, according to an embodiment of the present invention.
Figure 3:
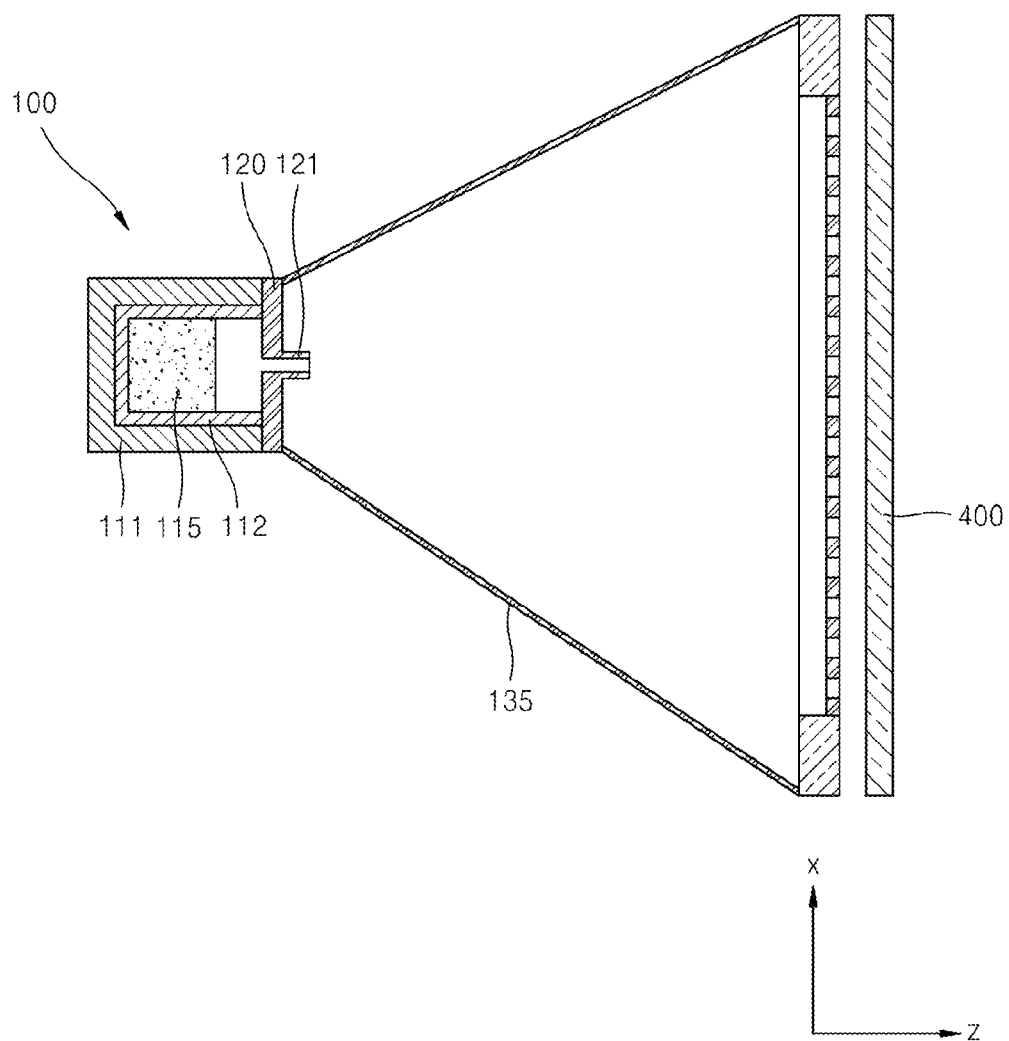
FIG. 3 is a schematic plan view of the thin film deposition apparatus of FIG. 1, according to an embodiment of the present invention.

FIG. 1 is a schematic perspective view of a thin film deposition apparatus 100 according to an embodiment of the present invention, FIG. 2 is a schematic side view of the thin film deposition apparatus 100, and FIG. 3 is a schematic plan view of the thin film deposition apparatus 100. The thin film deposition apparatus 100 includes a deposition source 110, a deposition source nozzle unit 120, and a patterning slit sheet 150.

Although a chamber is not illustrated in FIGS. 1, 2 and 3 for convenience of explanation, all the components of the thin film deposition apparatus 100 may be disposed within a chamber that is maintained at an appropriate degree of vacuum. The chamber is maintained at an appropriate vacuum in order to allow a deposition material to move in a substantially straight line through the thin film deposition apparatus 100.

In particular, in order to deposit a deposition material 115 that is emitted from the deposition source 110 and is discharged through the deposition source nozzle unit 120 and the patterning slit sheet 150, onto a substrate 400 in a desired pattern, it is required to maintain the chamber in a high-vacuum state as in a deposition method using a fine metal mask (FMM). In addition, the temperature of the patterning slit sheet 150 has to be sufficiently lower than the temperature of the deposition source 110. In this regard, the temperature of the patterning slit sheet 150 may be about 100° C. or less. The temperature of the patterning slit sheet 150 should be sufficiently low so as to reduce thermal expansion of the patterning slit sheet 150.

The substrate 400 constitutes a target on which the deposition material 115 is to be deposited. The substrate 400 is disposed in the chamber. The substrate 400 may be a substrate for flat panel displays. A large substrate, such as a mother glass, for manufacturing a plurality of flat panel displays, may be used as the substrate 400. Other substrates may also be employed. Examples of such a substrate include a size of 5 G or more, but the invention is not limited thereto.

In the current embodiment of the present invention, deposition may be performed while the substrate 400 and/or the thin film deposition apparatus 100 are moved relative to each other. In particular, in the conventional FMM deposition method, the size of the FMM has to be equal to the size of a substrate. Thus, the size of the FMM has to be increased as the substrate becomes larger. However, it is neither straightforward to manufacture a large FMM nor to extend an FMM to be accurately aligned with a pattern.

In order to overcome this problem, in the shown thin film deposition apparatus 100, deposition may be performed while the thin film deposition apparatus 100 and/or the substrate 400 are moved relative to each other. In other words, deposition may be continuously performed while the substrate 400, which is disposed to face the thin film deposition apparatus 100, is moved in a Y-axis direction. The deposition is performed in a scanning manner while the substrate 400 moves in a direction of arrow A in FIG. 1 relative to the deposition source 110. Although the substrate 400 is illustrated as being moved in the Y-axis direction in FIG. 1 when deposition is performed, the present invention is not limited thereto. Deposition may be performed while the thin film deposition apparatus 100 is moved in the Y-axis direction, whereas the substrate 400 is fixed, or where both are moved.

Thus, in the thin film deposition apparatus 100 according to the current embodiment of the present invention, the patterning slit sheet 150 may be significantly smaller than a FMM used in a conventional deposition method. In other words, in the thin film deposition apparatus 100 according to the current embodiment of the present invention, deposition is continuously performed (i.e., in a scanning manner) while the substrate 400 is moved in the Y-axis direction. Thus, lengths of the patterning slit sheet 150 in the X-axis and Y-axis directions may be significantly less than the lengths of the substrate 400 in the X-axis and Y-axis directions. As described above, since the patterning slit sheet 150 may be formed to be significantly smaller than a FMM used in a conventional deposition method, it is relatively easy to manufacture the patterning slit sheet 150 used in embodiments of the present invention. In other words, using the patterning slit sheet 150, which is smaller than a FMM used in a conventional deposition method, is more convenient in all processes, including etching and subsequent other processes, such as precise extension, welding, moving, and cleaning processes, compared to the conventional deposition method using the larger FMM. This is more advantageous for a relatively large display device.

In order to perform deposition while the thin film deposition apparatus 100 or the substrate 400 is moved relative to each other as described above, the thin film deposition apparatus 100 and the substrate 400 may be separated from each other by a predetermined distance. This will be described later in detail.

The deposition source 110 contains and heats the deposition material 115. The deposition source 110 is disposed at side of the chamber that is opposite to a side at which the substrate 400 is disposed. As the deposition material 115 contained in the deposition source 110 is vaporized, the deposition material 115 is deposited on the substrate 400.

In particular, the deposition source 110 includes a crucible 111 and a heater 112. The crucible 111 is filled with the deposition material 115. The heater 112 heats the crucible 111 to vaporize the deposition material 115, which is contained in the crucible 111. The vaporized deposition material 115 moves towards a side of the crucible 111, and in particular, towards the deposition source nozzle unit 120.

The deposition source nozzle unit 120 is disposed at a side of the deposition source 110, and in particular, at the side of the deposition source 110 facing the substrate 400. In addition, the deposition source nozzle unit 120 includes a plurality of deposition source nozzles 121 arranged at equal intervals in the Y-axis direction (that is, the scanning direction of the substrate 400). The deposition material 115 that is vaporized in the deposition source 110 passes through the deposition source nozzles 121 of deposition source nozzle unit 120 towards the substrate 400. As described above, when the plurality of deposition source nozzles 121 are formed on the deposition source nozzle unit 120 in the Y-axis direction, a size of the pattern formed by the deposition material 115 that is discharged through each of patterning slits 151 in the patterning slit sheet 150 is only affected by the size of one deposition source nozzle 121. That is, it may be considered that one deposition nozzle 121 exists in the X-axis direction, and thus there is no shadow zone on the substrate 400. In addition, since the plurality of deposition source nozzles 121 are formed in the scanning direction Y of the substrate 400, even if there is a difference between fluxes of the deposition source nozzles 121, the difference may be compensated and deposition uniformity may be maintained constantly.

The patterning slit sheet 150 is held in a frame 155. The patterning slit sheet 150 and the frame 155 are disposed between the deposition source 110 and the substrate 400. The frame 155 may be formed in a lattice shape, similar to a window frame, but the invention is not limited thereto. The patterning slit sheet 150 is bound inside the frame 155. The patterning slit sheet 150 includes a plurality of patterning slits 151 arranged in a row in the X-axis direction, with each slit 151 extending in the Y direction. The deposition material 115 that is vaporized in the deposition source 110, passes through the deposition source nozzle unit 120 and the patterning slit sheet 150 towards the substrate 400. The patterning slit sheet 150 may be manufactured by etching, which is the same method as used in a conventional method of manufacturing an FMM, and in particular, a striped FMM. Here, the total number of patterning slits 151 may be greater than the total number of deposition source nozzles 121, but the invention is not limited thereto.

In addition, the deposition source 110 (and the deposition source nozzle unit 120 coupled to the deposition source 110) and the patterning slit sheet 150 may be formed to be separated from each other by a predetermined distance. Alternatively, the deposition source 110 (and the deposition source nozzle unit 120 coupled to the deposition source 110) and the patterning slit sheet 150 may be connected by a connection member 135 as shown. That is, the deposition source 110, the deposition source nozzle unit 120, and the patterning slit sheet 150 may be formed integrally with each other by being connected to each other via the connection member 135. The connection member 135 guides the deposition material 115, which is discharged through the deposition source nozzles 121, to move in the Z and Y directions and not to flow in the X-axis direction. In FIGS. 1 through 3, the connection members 135 are formed on left and right sides of the deposition source 110, the deposition source nozzle unit 120, and the patterning slit sheet 150 to guide the deposition material 115 not to flow in the X-axis direction. However, the present invention is not limited thereto. That is, the connection member 135 may be formed as a sealed type of a box shape to guide the flow of the deposition material 115 in the X-axis and Y-axis directions.

As described above, the thin film deposition apparatus 100 performs deposition while being moved relative to the substrate 400. In order to move the thin film deposition apparatus 100 relative to the substrate 400, the patterning slit sheet 150 is separated from the substrate 400 by a predetermined distance.

In particular, in a conventional deposition method using a FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the thin film deposition apparatus 100 according to the current embodiment of the present invention, the patterning slit sheet 150 is disposed to be separated from the substrate 400 by a predetermined distance.

As described above, according to aspects of the present invention, a mask is formed to be smaller than a substrate, and deposition is performed while the mask is moved relative to the substrate. Thus, the mask can be easily manufactured. In addition, defects caused due to the contact between a substrate and a FMM, which occurs in the conventional deposition method, may be prevented. In addition, since it is unnecessary to use the FMM in close contact with the substrate during a deposition process, the manufacturing speed may be improved.

Figure 4:
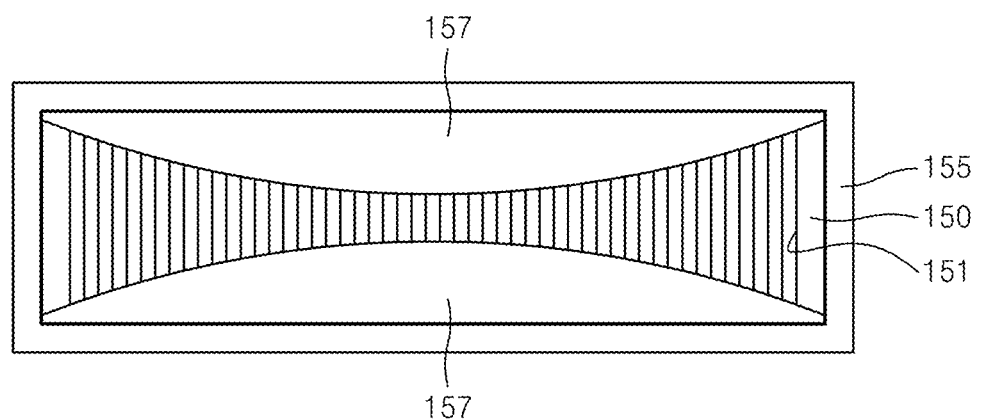
FIG. 4 is a plan view of a patterning slit sheet in a thin film deposition apparatus according to another embodiment of the present invention.

FIG. 4 is a plan view of the patterning slit sheet 150 in the thin film deposition apparatus, according to an embodiment of the present invention. In the current embodiment of the present invention, a correction plate 157 is further disposed at a side of the patterning slit sheet 150. As shown the there are two correction plates 157, but the invention is not limited thereto.

In particular, a thin film deposition apparatus of the current embodiment of the present invention shown in FIGS. 1 and 4 further includes the correction plate 157 in order to ensure uniformity of films formed on the substrate 400. In discharging an organic material (deposition material), the largest amount of organic material is discharged through a portion that is perpendicular to the deposition source nozzles 121 and the amount of discharged organic material is gradually reduced towards both ends of the patterning slit sheet 150 according to a cosine law. Thus, a deposition layer is likely to be formed having a bulgy center portion when the thin film deposition apparatus does not include the correction plate 157.

In order to make the thickness of the deposition layer less uneven, the correction plate 157 is disposed at each side of the patterning slit sheet 150. The correction plate 157 is formed on a surface of the patterning slit sheet 150 as a circular arc or a cosine curve. The correction plate 157 blocks some of the deposition material 115 discharged from the deposition source nozzles 121 towards the patterning slits 151. That is, since the deposition layer formed by the thin film deposition apparatus has a bulgy center portion, some of the deposition material discharged towards the center portion of the patterning slit sheet 150 has to be blocked in order to form the deposition layer of a uniform thickness. Therefore, the correction plate 157 is disposed on the way of the deposition material in order to block some of the deposition material. While shown as two correction plate 157, it is understood that the correction plate 157 can be a single plate having an opening which gradually widens as a function of distance from a center of the patterning slit sheet 150.

Here, since the correction plate 157 is formed to have the circular arc or the cosine curve shape, the deposition material discharged towards the center portion of the patterning slit sheet 150 is blocked more than the deposition material discharged towards left and right side portions of the patterning slit sheet 150. Then, the correction plate 157 may be disposed so that the thinnest part of the deposition layer (that is, parts of the deposition layer formed by the deposition material discharged through the both sides of the patterning slit sheet 150) becomes the entire thickness of the deposition layer.

As described above, since the correction plate 157 is disposed on the flowing path of the deposition material, the deposition layer formed by the thin film deposition apparatus 100 may be corrected. That is, a height of the correction plate 157 is increased in order to block more deposition material at the portion where a lot of deposition material is otherwise deposited, and the height of the correction plate 175 is reduced in order to block less deposition material at portions where less deposition material is deposited. Thus, the deposition amount of the deposition material may be adjusted so that the thickness of the deposition layer may be uniform.

According to the embodiment of the present invention shown in FIGS. 1 and 4, the uniformity of the thin film formed on the substrate 400 is within an error range of about 1 to about 2%, and thus, quality and reliability of the thin film deposition apparatus may be improved.

Figure 5:
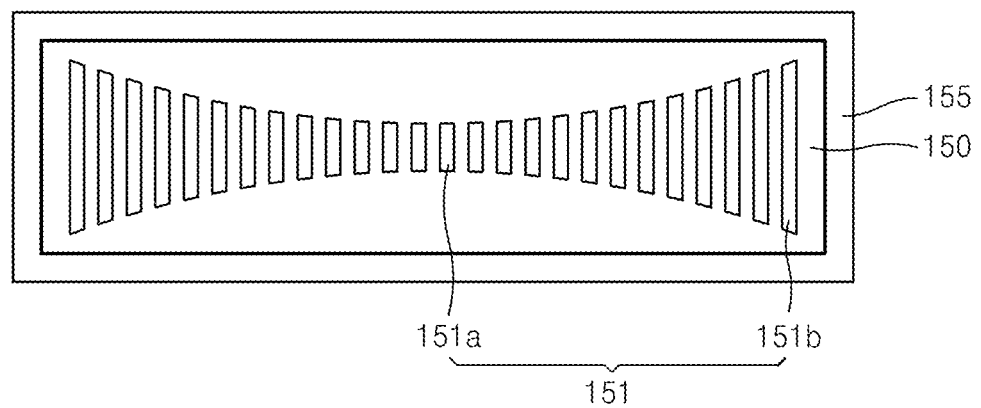
FIG. 5 is a plan view of a patterning slit sheet in a thin film deposition apparatus, according to another embodiment of the present invention.

FIG. 5 is a plan view of a patterning slit sheet 150 in a thin film deposition apparatus according to another embodiment of the present invention. In the current embodiment of the present invention, a length of patterning slit 151a located at a center portion of the patterning slit sheet 150 is less than those of patterning slits 151b located at both end portions of the patterning slit sheet 150 in order to ensure uniformity of the thin films formed on the substrate 400.

As described above, the deposition amount of the deposition material may be adjusted so that the thickness of the entire deposition layer may be constant by using the patterning slit sheet 150, in which the length of the patterning slit 151a at the center portion and the lengths of the patterning slits 151b at both ends of the patterning slit sheet 150 may be different from each other, like in the previous embodiment. In the thin film deposition apparatus 100 according to the current embodiment of the present invention shown in FIGS. 1 and 5, the uniformity of the thin film formed on the substrate 400 is within an error range of about 1 to about 2%. Thus, the quality and reliability of the thin film deposition apparatus 100 may be improved.

Figure 6:
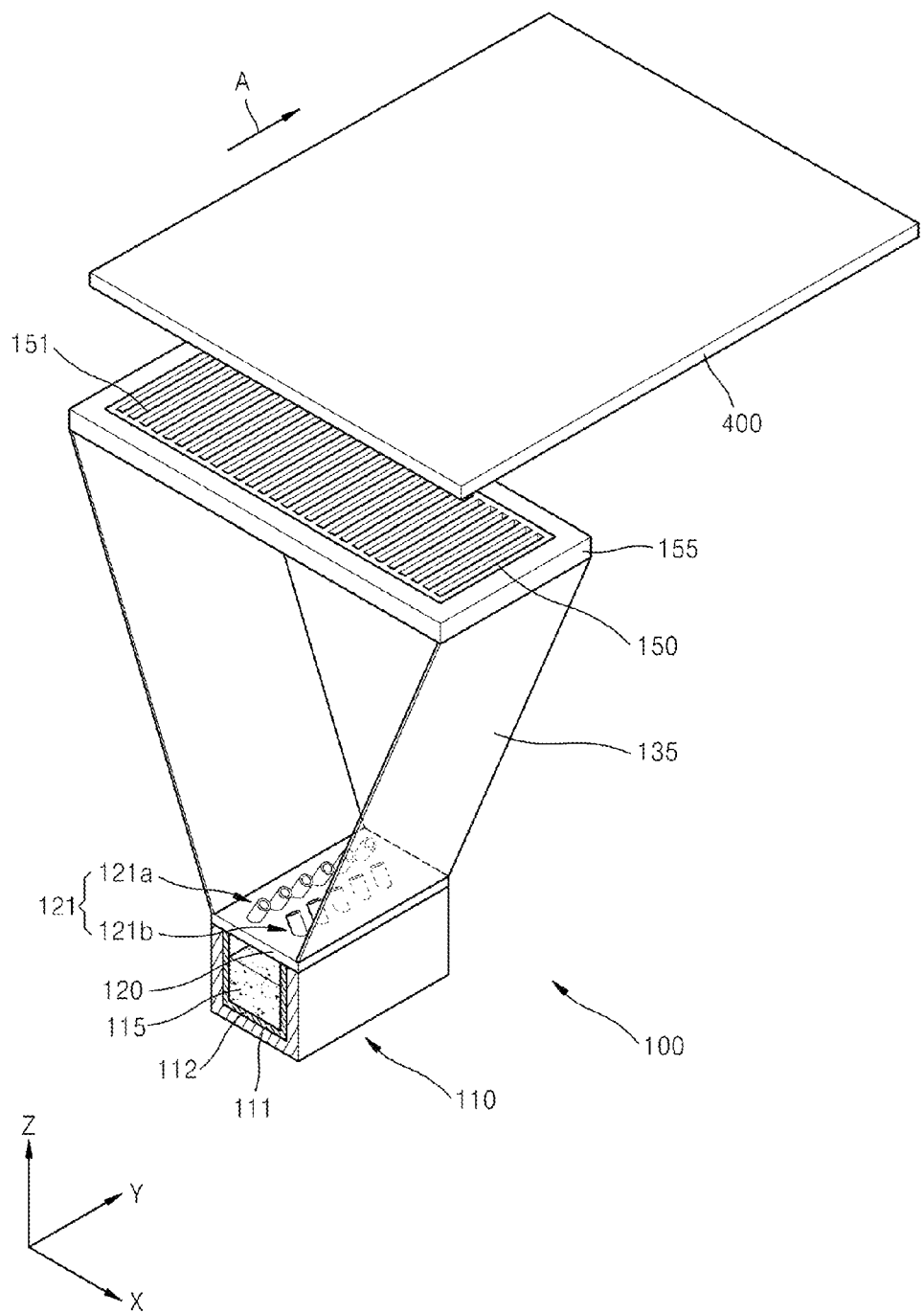
FIG. 6 is a schematic perspective view of a thin film deposition apparatus according to another embodiment of the present invention.

FIG. 6 is a perspective view of a thin film deposition apparatus 100 according to another embodiment of the present invention. Referring to FIG. 6, the thin film deposition apparatus 100 includes a deposition source 110, a deposition source nozzle unit 120, and a patterning slit sheet 150. In particular, the deposition source 110 includes a crucible 111 and a heater 112. The crucible 111 is filled with the deposition material 115. The heater 112 heats the crucible 111 to vaporize the deposition material 115, which is contained in the crucible 111. The vaporized deposition material 115 moves towards a side of the crucible 111, and in particular, towards the deposition source nozzle unit 120.

The deposition source nozzle unit 120 has a planar shape and is disposed at a side of the deposition source 110. The deposition source nozzle unit 120 includes a plurality of deposition source nozzles 121 arranged in the Y-axis direction. The patterning slit sheet 150 and a frame 155 are further disposed between the deposition source 110 and the substrate 400, and the patterning slit sheet 150 includes a plurality of patterning slits 151 arranged in the X-axis direction. The deposition source 110, the deposition source nozzle unit 120, and the patterning slit sheet 150 are connected to each other by the connection member 135.

The plurality of deposition source nozzles 121 formed on the deposition source nozzle unit 120 are tilted at a predetermined angle. In particular, the deposition source nozzles 121 may include deposition source nozzles 121a and 121b which are arranged in two rows, which are alternately arranged with each other. Here, the deposition source nozzles 121a and 121b may be tilted at a predetermined angle on an X-Z plane. However, the invention is not limited in relation to the number of rows of nozzles 121, and it is understood that the nozzles could also be further tilted in the Y-Z plane.

If the correction plate 157 of FIG. 4 is used or the lengths of the patterning slits 151 of FIG. 5, an efficiency of utilizing deposition material may be degraded because the deposition material is blocked by the correction plate 157 or the patterning slits 151. Therefore, in the current embodiment of the present invention shown in FIG. 6, the deposition source nozzles 121a and 121b are arranged in tilted states at a predetermined angle. Here, the deposition source nozzles 121a in a first row may be tilted toward the deposition nozzles 121b in a second row, and the deposition source nozzles 121b in the second row may be tilted toward the deposition source nozzles 121a in the first row. That is, the deposition source nozzles 121a arranged in the row at the left side of the patterning slit sheet 150 are arranged to face the right side of the patterning slit sheet 150, and the deposition source nozzles 121b arranged in the row at the right side of the patterning slit sheet 150 are arranged to face the left side of the patterning slit sheet 150. While shown as having a same angle, it is understood that each row 121a, 121b need not have the same angle.

Figure 7:
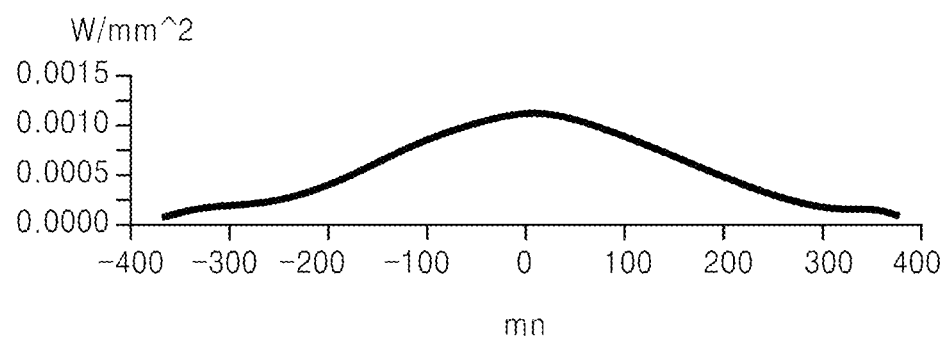
FIG. 7 is a graph schematically illustrating a distribution pattern of a deposition layer formed on a substrate when a deposition source nozzle is not tilted, in a thin film deposition apparatus according to an embodiment of the present invention.
Figure 8:
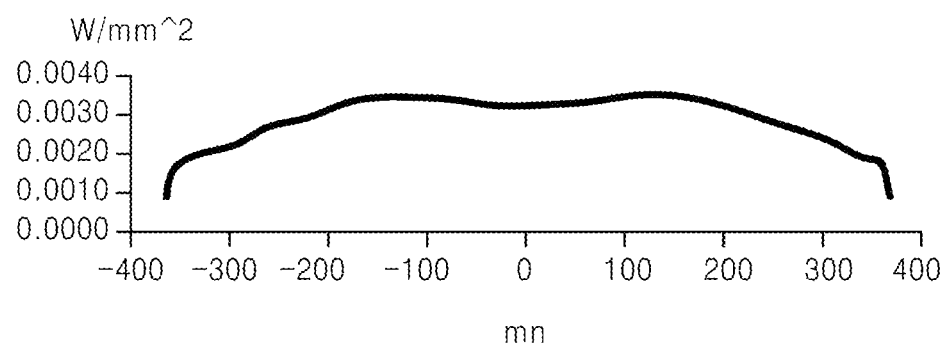
FIG. 8 is a graph schematically illustrating a distribution pattern of a deposition layer formed on a substrate when a deposition source nozzle is tilted, in a thin film deposition apparatus according to an embodiment of the present invention.

FIG. 7 is a graph showing a distribution of the deposition layer formed on the substrate 400 when the deposition source nozzles 121 are not tilted. FIG. 8 is a graph showing a distribution of the deposition layer formed on the substrate 400 when the deposition source nozzles 121 are tilted. When comparing the graphs of FIGS. 7 and 8 with each other, the deposition layer thickness formed on both end portions of the substrate 400 when the deposition source nozzles 121 are tilted is relatively greater than that of the deposition layer formed on the substrate 400 when the deposition source nozzles 121 are not tilted. Thus, the uniformity of the deposition layer is improved when the deposition source nozzles 121 are tilted. Therefore, the deposition amount of the deposition material may be adjusted so that a difference between the thicknesses of the deposition layer at the center portion and end portions of the substrate may be reduced and the entire thickness of the deposition layer may be constant. Moreover, the efficiency of utilizing the deposition material may be improved.

Figure 9:
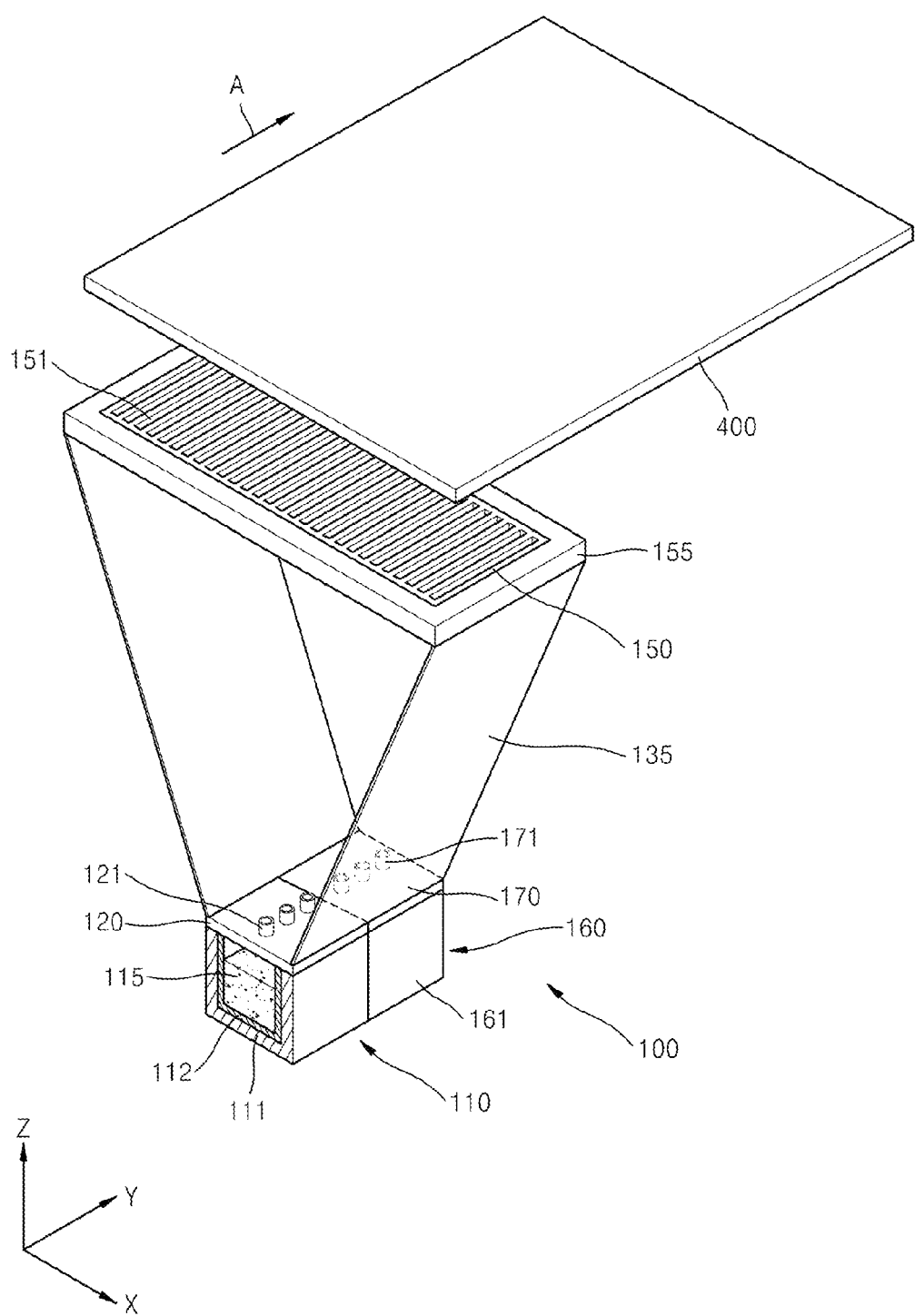
FIG. 9 is a schematic perspective view of a thin film deposition apparatus according to another embodiment of the present invention.

FIG. 9 is a schematic perspective view of the thin film deposition apparatus 100 according to another embodiment of the present invention. Referring to FIG. 9, the thin film deposition apparatus 100 includes a first deposition source 110, a first deposition source nozzle unit 120, a second deposition source 160, a second deposition source nozzle unit 170, and a patterning slit sheet 150. The patterning slit sheet 150 and a frame 155 are disposed between the first deposition source 110 and the second deposition source 160, and the substrate 400. The patterning slit sheet 150 includes a plurality of patterning slits 151 arranged in a row in the X-axis direction. In addition, the first deposition source 110, the second deposition source 160, the first deposition source nozzle unit 120, the second deposition source nozzle unit 170, and the patterning slit sheet 150 are connected to each other by the connection member 135.

In the thin film deposition apparatus 100, the first deposition source 110 contains a host material 115 and the second deposition source 160 contains a dopant material (not shown). As such, the host material 115 and the dopant material may be simultaneously deposited on the substrate 400. That is, since the host material 115 and the dopant material (not shown) are vaporized at different temperatures from each other, the plurality of deposition sources 110 and 160 and the plurality of deposition source nozzle units 120 and 170 are provided to deposit the host material 115 and the dopant material at the same time.

Specifically, the first deposition source 110 and the second deposition source 160 contain and heat the deposition materials. The first deposition source 110 and the second deposition source 160 are disposed at a side of the chamber that is opposite to a side at which the substrate 400 is disposed. As the deposition materials contained in the first deposition source 110 and the second deposition source 160 are vaporized, the deposition materials are deposited on the substrate 400.

In particular, the first deposition source 110 includes a crucible 111 that is filled with the host material 115, and a heater 112. The heater 112 heats the crucible 111 to vaporize the host material 115. The vaporized host material 115 moves towards a side of the crucible 111, and in particular, towards the first deposition source nozzle unit 120. The second deposition source 160 includes a crucible 161 that is filled with the dopant material (not shown), and a heater (not shown). The heater (not shown) heats the crucible 161 to vaporize the dopant material (not shown). The vaporized dopant material (not shown) moves towards a side of the crucible 161, and in particular, towards the second deposition nozzle unit 170.

Examples of the host material may include tris(8-hydroxy-quinolinato)aluminum (Alq3), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4''-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), etc.

Examples of the dopant material may include DPAVBi (4,4'-bis[4-(di-p-tolylamino)styryl]biphenyl), ADN (9,10-di(naph-2-tyl)anthracene), TBADN (3-tert-butyl-9,10-di(naph-2-tyl)anthracene), etc.

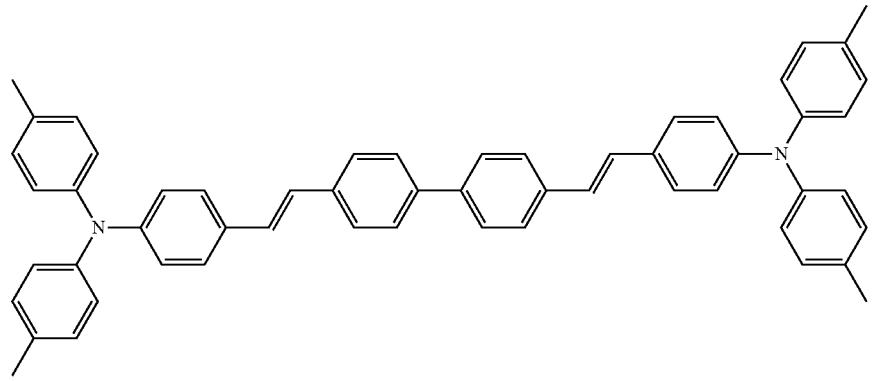

DPAVBi

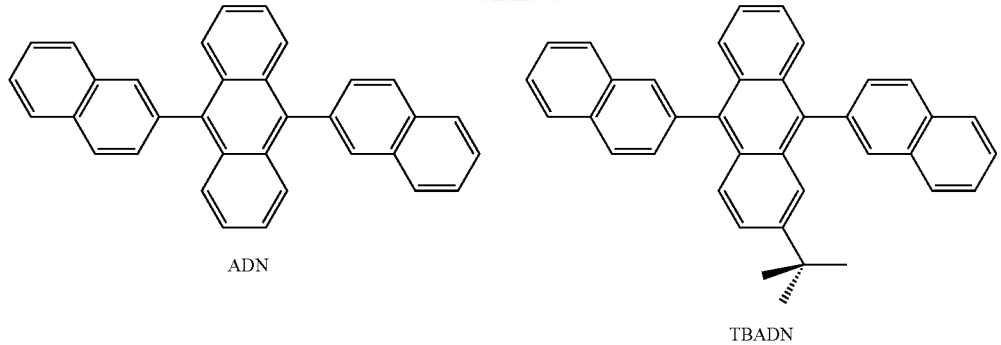

ADN

TBADN

As described above, the thin film deposition apparatus 100 is characterized in that the first deposition source 110 contains the host material 115 and the second deposition source 160 contains the dopant material (not shown). The first deposition source 110 and the second deposition source 160 are provided so that the host material 115 and the dopant material are simultaneously deposited on the substrate 400. Since the host material 115 and the dopant material may be simultaneously deposited on the substrate 400, the deposition process may be simplified and performed rapidly, which improves the efficiency of the thin film deposition apparatus 100.

Figure 10:
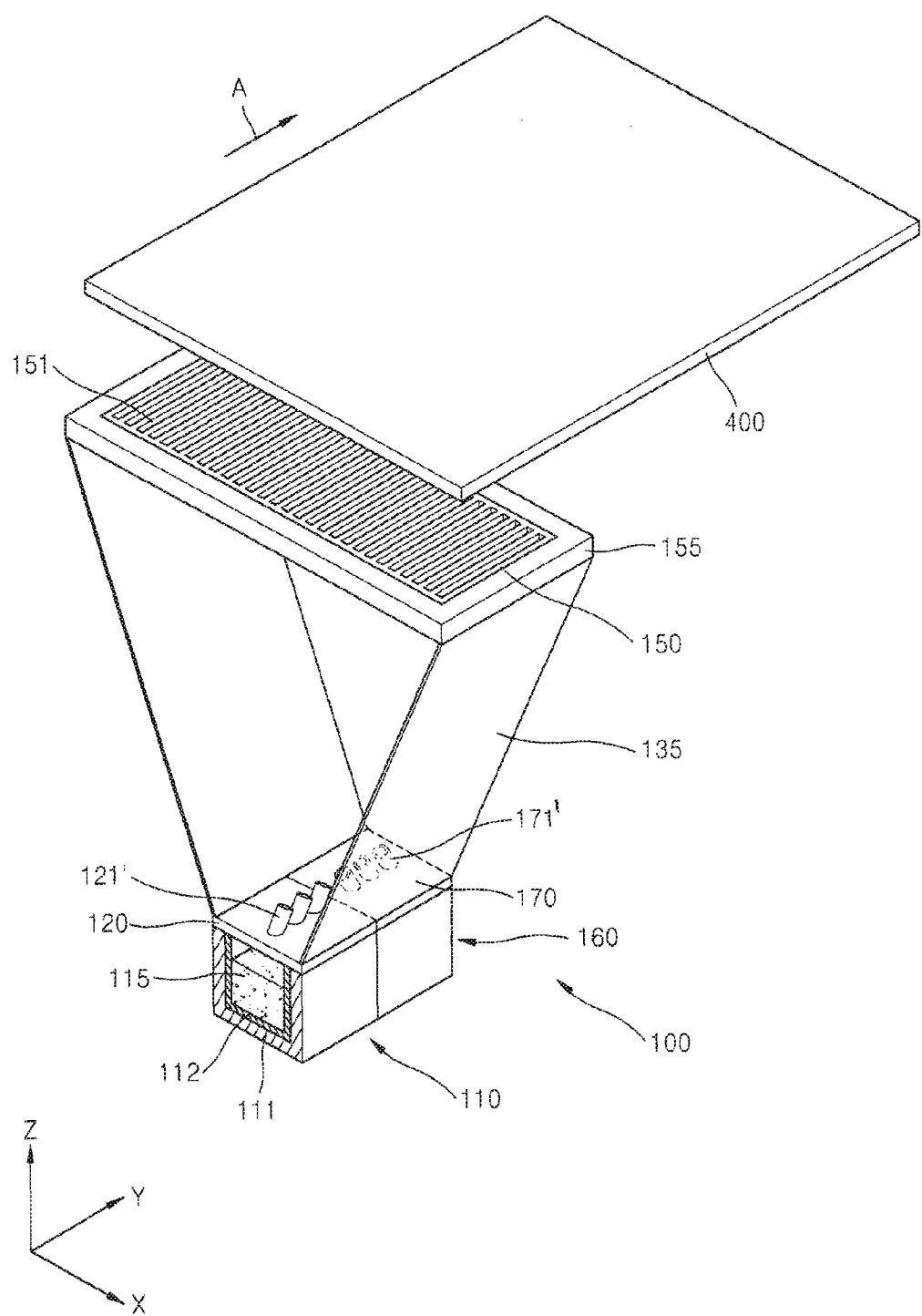
FIG. 10 is a schematic perspective view of a thin film deposition apparatus according to another embodiment of the present invention.

FIG. 10 is a schematic perspective view of a thin film deposition apparatus 100 according to another embodiment of the present invention. Referring to FIG. 10, the thin film deposition apparatus 100 includes a first deposition source 110, a first deposition source nozzle unit 120, a second deposition source 160, a second deposition source nozzle unit 170, and a patterning slit sheet 150. The patterning slit sheet 150 and a frame 155 are disposed between the first and second deposition sources 110 and 160 and the substrate 400. The patterning slit sheet 150 includes a plurality of patterning slits 151 arranged in a row in the X-axis direction. In addition, the first and second deposition sources 110 and 160, the first and second deposition source nozzle units 120 and 170, and the patterning slit sheet 150 are connected to each other by the connection member 135. In the thin film deposition apparatus 100, the first deposition source 110 contains a host material 115 and the second deposition source 160 contains a dopant material (not shown) so that the host material 115 and the dopant material may be simultaneously deposited on the substrate 400.

The thin film deposition apparatus 100 is different from that of the previous embodiments shown in FIG. 9 in that a plurality of deposition source nozzles 121' and 171' are respectively formed on the first and second deposition source nozzle units 120 and 170. The deposition source nozzles 121' and 171' are tilted at a predetermined angle. That is, the deposition source nozzles 121' and 171' are tilted at a predetermined angle on a Y-Z plane.

Although a content of the dopant material may vary depending on the material forming thin films, the dopant material may be contained by about 3 to about 20 parts by weight in the thin film forming material (total weight of the host and dopant materials) of 100 parts by weight. If the content of the dopant material exceeds the above described range, the light emitting property of an organic light emitting display device may be degraded. However, when the deposition source nozzles 121 and 171 are arranged in parallel with a Z-axis like in the previous embodiment described with reference to FIG. 9, the dopant material is deposited on the substrate 400 at an initial stage of the deposition process, the dopant material and the host material are alternatively deposited on the substrate 400 at an intermediate stage of the deposition process, and the host material is deposited on the substrate 400 at a rear stage of the deposition process. That is, mixture ratios of the host material and the dopant material may vary depending on regions of the substrate 400.

Thus, in the thin film deposition apparatus 100 according to the current embodiment of the present invention shown in FIG. 10, the deposition source nozzles 121' and 171' are tilted at a predetermined angle. The deposition source nozzles 121' of the first deposition source nozzle unit 120 and the deposition source nozzles 171' of the second deposition source nozzle unit 170 may be tilted to face each other. That is, the deposition source nozzles 121' of the first deposition source nozzle unit 120 may be tilted to face the second deposition source 170, and the deposition source nozzles 171' of the second deposition source nozzle unit 170 may be tilted to face the first deposition source 120.

Through the above described structure, the mixing ratio of the host material 115 and the dopant material in the deposition material may be constant throughout the entire substrate 400. In addition, if the thin films are formed by using the mixture in which the host material 115 and the dopant material are mixed with a constant mixture ratio, the thin films may represent improved characteristics in view of color coordinate, optical efficiency, driving voltage, and lifespan.

Figure 11:
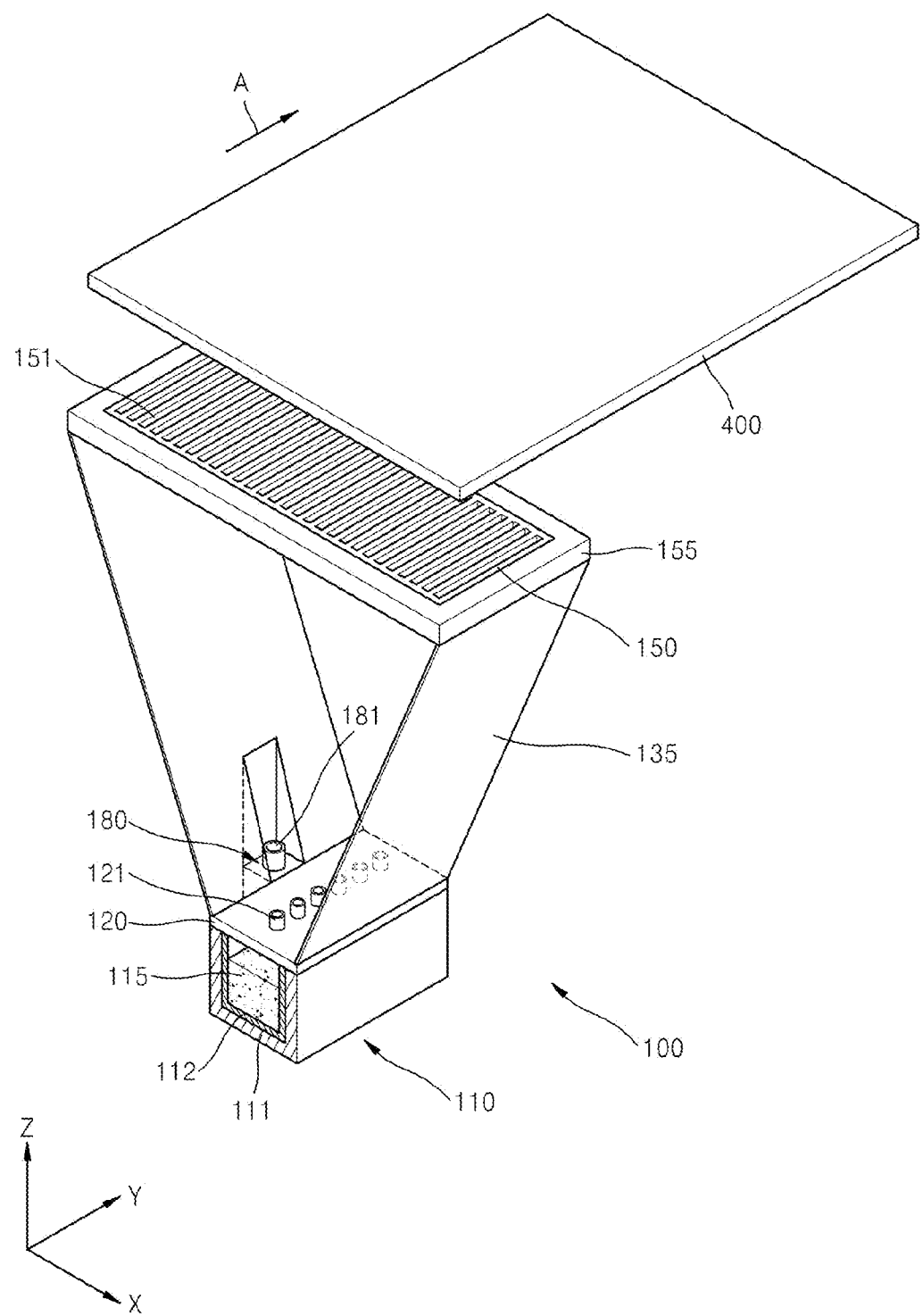
FIG. 11 is a schematic perspective view of a thin film deposition apparatus according to another embodiment of the present invention.

FIG. 11 is a schematic perspective view of a thin film deposition apparatus 100 according to another embodiment of the present invention. Referring to FIG. 11, the thin film deposition apparatus 100 includes a first deposition source 110, a first deposition source nozzle unit 120, a second deposition source 180, a second deposition nozzle 181, and a patterning slit sheet 150. The patterning slit sheet 150 and a frame 155 are disposed between the first and second deposition sources 110 and 180 and the substrate 400. The patterning slit sheet 150 includes a plurality of patterning slits 151 arranged in the X-axis direction. In addition, the first and second deposition sources 110 and 180, the first deposition source nozzle unit 120 and the second deposition source nozzle 181, and the patterning slit sheet 150 are connected to each other by the connection member 135. The first deposition source 110 contains a host material 115. The second deposition source 180 contains a dopant material (not shown) so that the host material 115 and the dopant material may be simultaneously deposited on the substrate 400.

The thin film deposition apparatus 100 shown in FIG. 11 is different from the thin film deposition apparatus 100 shown in FIG. 9 in that the second deposition source 180 is a point source, not a linear source. As described above, the dopant material may be contained by about 3 to about 20 parts by weight in the thin film forming material (total weight of the host and dopant materials) of 100 parts of weight. That is, since the dopant material is relatively less than the host material in the thin film forming material, it is not necessary to use the linear source having a large capacity for containing the dopant material. Thus, in the thin film deposition apparatus 100 shown in FIG. 11, the first deposition source 110 containing the host material is formed as the linear source, and the second deposition source 180 containing the dopant material is formed as the point source.

Here, although the second deposition source 180 (that is, a point source) is disposed in FIG. 11, the present invention is not limited thereto. That is, a plurality of second deposition sources may be provided according to the content amount of the dopant material that is needed.

As described above, since the second deposition source 180 is formed as the point source, the thin film deposition apparatus 100 may have a simple structure and fabrication costs of the thin film deposition apparatus 100 may be reduced.

Figure 12:
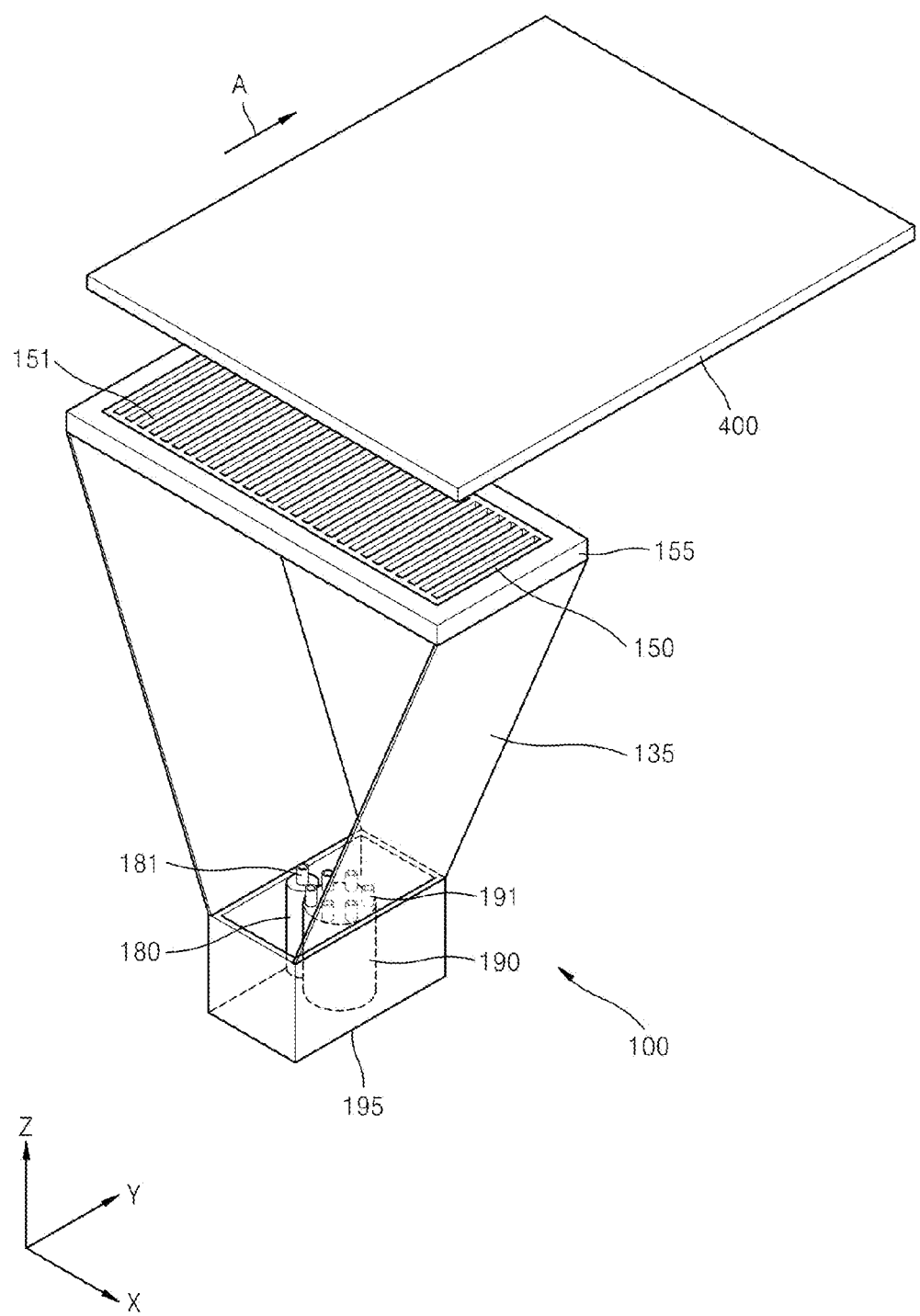
FIG. 12 is a schematic perspective view of a thin film deposition apparatus according to another embodiment of the present invention.

FIG. 12 is a schematic perspective view of a thin film deposition apparatus 100 according to another embodiment of the present invention. Referring to FIG. 12, the thin film deposition apparatus 100 includes a first deposition source 190, a first deposition source nozzle 191, a second deposition source 180, a second deposition source nozzle 181, and a patterning slit sheet 150. The patterning slit sheet 150 and a frame 155 are disposed between the first and second deposition sources 190 and 180 and the substrate 400. The patterning slit sheet 150 includes a plurality of patterning slits 151 arranged in the X-axis direction. In addition, the first and second deposition sources 190 and 180 and the deposition source nozzles 181 and 191 are accommodated in a deposition source accommodation unit 195. The deposition source accommodation unit 195 and the patterning slit sheet 150 are connected to each other by the connection member 135. In the thin film deposition apparatus 100, the first deposition source 190 contains a host material (not shown) and the second deposition source 180 contains a dopant material (not shown) so that the host material and the dopant material may be simultaneously deposited on the substrate 400.

The thin film deposition apparatus 100 shown in FIG. 12 is different from the thin film deposition apparatus 100 shown in FIG. 11 in that the first deposition source 190 is a point source, not a linear source. In particular, as a distance between the deposition sources 180 and 190 and the substrate 400 is increased, the point source may be more favorable for performing the deposition than the linear source. Therefore, the first deposition source 190 containing the host material and the first deposition source nozzles 191 may be formed as a plurality of point sources. In particular, the first deposition source 190 on which the first deposition source nozzles 191 are formed may be formed as a revolver. As described above, since the first and second deposition sources 190 and 180 are formed as the point sources, the thin film deposition apparatus 100 may have a simple structure and fabrication costs of the thin film deposition apparatus 100 may be reduced.

Figure 13:
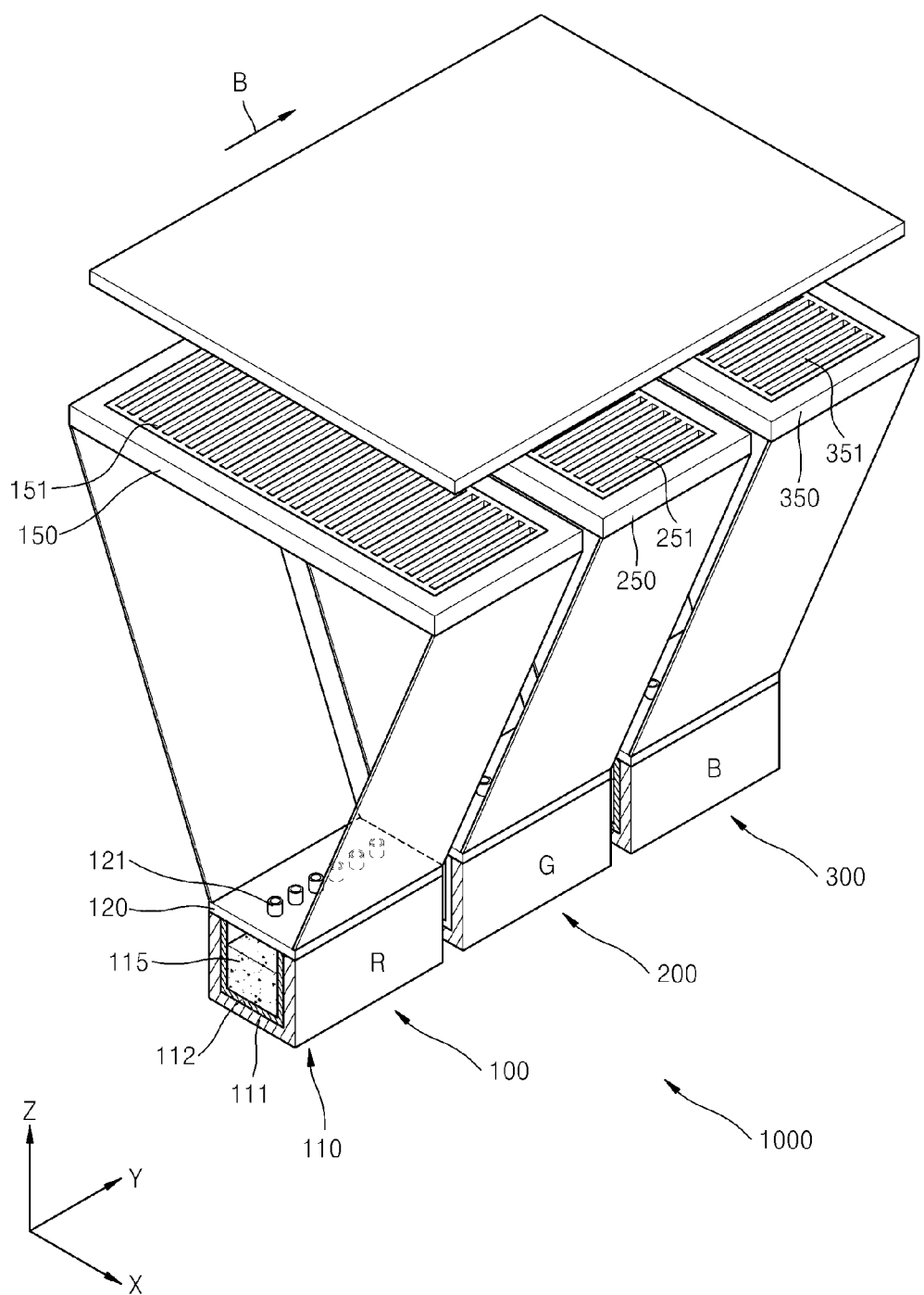
FIG. 13 is a schematic perspective view of a thin film deposition apparatus according to another embodiment of the present invention.

FIG. 13 is a schematic perspective view of a thin film deposition assembly 1000 according to another embodiment of the present invention. Referring to FIG. 13, the thin film deposition assembly 1000 includes a plurality of thin film deposition apparatuses 100, 200, 300. Each of the thin film deposition apparatuses 100, 200, 300 has the structure like that of the thin film deposition apparatus 100 illustrated in FIGS. 1 through 3. In other words, the thin film deposition assembly 1000 includes a multi-deposition source that simultaneously discharges deposition materials for forming the R emission layer, the G emission layer, and the B emission layer.

In particular, the thin film deposition assembly 1000 includes a first thin film deposition apparatus 100, a second thin film deposition apparatus 200, and a third thin film deposition apparatus 300. Each of the first thin film deposition apparatus 100, the second thin film deposition apparatus 200, and the third thin film deposition apparatus 300 has the same structure as the thin film deposition apparatus 100 described with reference to FIGS. 1 through 3, and thus a detailed description thereof will not be provided here.

The deposition sources 110 of the first thin film deposition apparatus 100, the second thin film deposition apparatus 200 and the third thin film deposition apparatus 300 may contain different deposition materials, respectively. The first thin film deposition apparatus 100 may contain a deposition material for forming a R emission layer, the second thin film deposition apparatus 200 may contain a deposition material for forming a G emission layer, and the third thin film deposition apparatus 300 may contain a deposition material for forming a B emission layer.

In other words, in a conventional method of manufacturing an organic light-emitting display device, a separate chamber and mask are used to form each color emission layer. However, when the thin film deposition assembly 1000 according to the current embodiment of the present invention is used, the R emission layer, the G emission layer and the B emission layer may be formed at the same time with a single multi-deposition source. Thus, the time it takes to manufacture the organic light-emitting display device is sharply reduced. In addition, the organic light-emitting display device may be manufactured with less chambers, so that equipment costs are also markedly reduced.

A patterning slit sheet 150 of the first thin film deposition apparatus 100, a patterning slit sheet 250 of the second thin film deposition apparatus 200, a patterning slit sheet 350 of the third thin film deposition apparatus 300 may be arranged to be offset by a constant distance with respect to each other, in order for deposition regions corresponding to the patterning slit sheets 150, 250 and 350 not to overlap on the substrate 400. In other words, when the first thin film deposition apparatus 100, the second thin film deposition apparatus 200, and the third thin film deposition apparatus 200 are used to deposit a R emission layer, a G emission layer and a B emission layer, respectively, patterning slits 151 of the first thin film deposition apparatus 100, patterning slits 251 of the second thin film deposition apparatus 200, and patterning slits 351 of the second thin film deposition apparatus 300 are arranged not to be aligned with respect to each other, in order to form the R emission layer, the G emission layer and the B emission layer in different regions of the substrate 400.

In addition, the deposition materials for forming the R emission layer, the G emission layer, and the B emission layer may have different deposition temperatures. Therefore, the temperatures of the deposition sources of the respective first, second, and third thin film deposition apparatuses 100, 200, and 300 may be set to be different.

Although the thin film deposition assembly 1000 according to the current embodiment of the present invention includes three thin film deposition apparatuses 100, 200, 300, the present invention is not limited thereto. In other words, a thin film deposition assembly according to another embodiment of the present invention may include a plurality of thin film deposition apparatuses, each of which contains a different deposition material. For example, a thin film deposition assembly according to another embodiment of the present invention may include five thin film deposition apparatuses respectively containing materials for a R emission layer, a G emission layer, a B emission layer, an auxiliary layer (R') of the R emission layer, and an auxiliary layer (G') of the G emission layer.

As described above, a plurality of thin films may be formed at the same time with a plurality of thin film deposition apparatuses, and thus manufacturing yield and deposition efficiency are improved. In addition, the overall manufacturing process is simplified, and the manufacturing costs are reduced.

Figure 14:
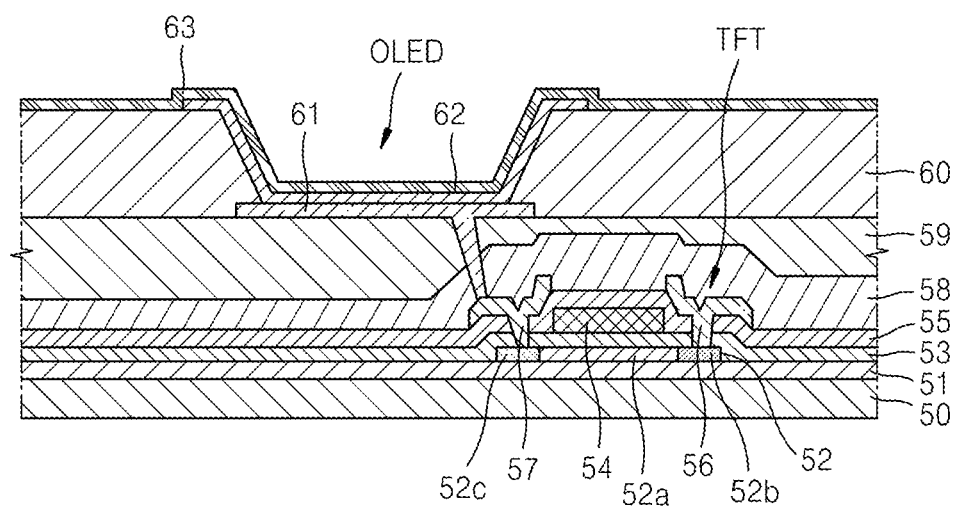
FIG. 14 is a cross-sectional view of an active matrix type organic light emitting display device fabricated by using a thin film deposition apparatus according to an embodiment of the present invention.

FIG. 14 is a cross-sectional view of an active matrix type organic light emitting display device fabricated by using a thin film deposition apparatus, according to an embodiment of the present invention. Referring to FIG. 14, a buffer layer 51 is formed on a substrate 50 formed of glass or plastic. A thin film transistor (TFT) and an organic light emitting display device (OLED) are formed on the buffer layer 51.

An active layer 52 having a predetermined pattern is formed on the buffer layer 51. A gate insulating layer 53 is formed on the active layer 52. A gate electrode 54 is formed in a predetermined region of the gate insulating layer 53. The gate electrode 54 is connected to a gate line (not shown) that applies a TFT ON/OFF signal. An interlayer insulating layer 55 is formed on the gate electrode 54. Source/drain electrodes 56 and 57 are formed such as to contact source/drain regions 52a and 52c, respectively, of the active layer 52 through contact holes. A passivation layer 58 is formed of $SiO_2$, $SiN_x$, etc. on the source/drain electrodes 56 and 57. A planarization layer 59 is formed of an organic material, such as acryl, polyimide, benzocyclobutene (BCB), etc., on the passivation layer 58. A pixel electrode 61, which functions as an anode of the OLED, is formed on the planarization layer 59. A pixel defining layer 60 formed of an organic material covers the pixel electrode 61. An opening is formed in the pixel defining layer 60, and an organic layer 62 is formed on a surface of the pixel defining layer 60 and on a surface of the pixel electrode 61 exposed through the opening. The organic layer 62 includes an emission layer. The present invention is not limited to the structure of the organic light-emitting display device described above, and various structures of organic light-emitting display devices may be applied to the present invention.

The OLED displays predetermined image information by emitting red, green and blue light as current flows. The OLED includes the pixel electrode 61, a counter electrode 63, and the organic layer 62. The pixel electrode 61 is connected to the drain electrode 56 of the TFT and to which a positive power voltage is applied. The counter electrode 63 is formed so as to cover the entire sub-pixel and to which a negative power voltage is applied. The organic layer 62 is disposed between the pixel electrode 61 and the counter electrode 63 to emit light. The pixel electrode 61 and the counter electrode 63 are insulated from each other by the organic layer 62, and respectively apply voltages of opposite polarities to the organic layer 62 to induce light emission in the organic layer 62.

The organic layer 62 may include a low-molecular weight organic layer or a high-molecular weight organic layer. When a low-molecular weight organic layer is used as the organic layer 62, the organic layer 62 may have a single or multi-layer structure including at least one selected from the group consisting of a hole injection layer (HIL), a hole transport layer (HTL), an emission layer (EML), an electron transport layer (ETL), an electron injection layer (EIL), etc. Examples of available organic materials include copper phthalocyanine (CuPc), N,N'-di(naphthalene-1-yl)-N,N'-diphenyl-benzidine (NPB), tris-8-hydroxyquinoline aluminum (Alq3), or the like. The low-molecular weight organic layer may be formed by vacuum deposition.

When a high-molecular weight organic layer is used as the organic layer 62, the organic layer 62 may mostly have a structure including a HTL and an EML. In this case, the HTL may be formed of poly(ethylenedioxythiophene) (PEDOT), and the EML may be formed of polyphenylenevinylenes (PPVs) or polyfluorenes. The HTL and the EML may be formed by screen printing, inkjet printing, or the like.

The organic layer 62 is not limited to the organic layers described above, and may be embodied in various ways.

The pixel electrode 61 functions as an anode, and the counter electrode 63 functions as a cathode. Alternatively, the pixel electrode 61 may function as a cathode, and the counter electrode 63 may function as an anode.

The pixel electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer.

The counter electrode 63 may be formed as a transparent electrode or a reflective electrode. When the counter electrode 63 is formed as a transparent electrode, the counter electrode 63 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 62 and forming an auxiliary electrode layer or a bus electrode line thereon from a transparent electrode forming material, such as ITO, IZO, ZnO, $In_2O_3$, or the like. When the counter electrode 63 is formed as a reflective electrode, the reflective layer may be formed by depositing Li, Ca, LiF/Ca, LiF/Al, Al, Ag, Mg, or a compound thereof on the entire surface of the organic layer 62.

In the organic light-emitting display apparatus described above, the organic layer 62 including the emission layer may be formed by using a thin film deposition apparatus 100 (refer to FIG. 1), which is described above. The thin film deposition apparatuses according to the embodiments of the present invention described above may be applied to form an organic layer or an inorganic layer of an organic TFT, and to form layers from various materials.

As described above, the thin film deposition apparatus according to aspects of the present invention may be easily manufactured and may be simply applied to produce large-sized display devices on a mass scale. The thin film deposition apparatus may improve manufacturing yield and deposition efficiency.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing a thin film on a substrate, the method comprising:
passing deposition material through a plurality of deposition source nozzles of a deposition source nozzle unit, the deposition source nozzles being arranged in one or two rows extending in a first direction, each of the one or two rows comprising more than three of the deposition source nozzles;
passing the deposition material from the deposition source nozzle unit through a plurality of patterning slits in a patterning slit sheet, the patterning slits being arranged in a row in a second direction that is perpendicular to the first direction, each of the patterning slits being extended in the first direction, an outermost one of the plurality of patterning slits along the second direction being spaced apart outwardly in the second direction from the deposition source nozzle unit, wherein the patterning slit sheet is connected to the deposition source nozzle unit such that the substrate is movable with respect to the deposition source nozzle unit and the patterning slit sheet; and
depositing the passed deposition material during a relative linear motion between the patterning slit sheet and the substrate to form the thin film,
wherein the deposition material from the deposition source nozzle unit is patterned on the substrate by the patterning slit sheet in pattern in which the deposition material is deposited at first regions on the substrate corresponding to the patterning slits and is not deposited at second regions on the substrate adjacent the first regions and corresponding to portions of the patterning slit sheet that do not have the patterning slits, each of the portions of the patterning slit sheet that do not have the pattern slits extending parallel to the first direction between a respective pair of adjacent patterning slits of the plurality of patterning slits,
wherein in a state in which the patterning slit sheet for patterning the deposition material on the substate is adjacent to the substrate and not coupled to the substrate, the depositing of the passed deposition material is performed while the substrate moves linearly in the first direction relative to a thin film deposition apparatus that is in a fixed state, the thin film deposition apparatus comprising the deposition source nozzle unit and the patterning slit sheet, and
wherein the depositing source nozzle unit and the patterning slit sheet are connected by a connection member arranged obliquely from the deposition source nozzle unit to the patterning slit sheet.

2. The method of claim, 1 wherein:
the deposition material comprises a first material and a second material, and
the depositing the passed deposition material comprises simultaneously depositing the first material and the second material in the thin film.

3. The method of claim 1. wherein the passing the deposition material comprises adjusting an amount of the deposition material passing through central ones of the patterning slits to be substantially the same as an amount of the deposition material passing, through edge ones of the patterning slits.

4. The method of claim 1, further comprising, while depositing the deposition material in the thin film, forming another thin film on the substrate by
passing another deposition material from another deposition source nozzle Unit through patterning slits, in another patterning slit sheet, the another patterning slit sheet having a length which is substantially less than a length of the substrate; and
depositing the passed another deposition, material along the length of the substrate during a relative motion between the another patterning slit sheet and the substrate to form the another thin film.

5. The method of claim 1, wherein the method utilizes the thin film deposition apparatus comprising:
a deposition source that discharges the deposition material;
the deposition source nozzle unit disposed at a side of the deposition source and including the plurality of deposition source nozzles arranged in the first direction; and
the patterning, slit sheet disposed opposite to the deposition source nozzle unit and including the plurality of patterning slits arranged in the row in the second direction that is perpendicular to the in direction,
wherein:
depositing the passed deposition material is performed while the substrate is moved relative to the thin film deposition apparatus in the first direction, and
the deposition source, the deposition source nozzle unit, and the patterning slit sheet are formed integrally.

6. The method of claim 5, wherein the thin film deposition apparatus further comprises the connection member which connects the deposition source, the deposition source nozzle unit, and the patterning slit sheet.

7. The method of claim 6, wherein the connection member guides movement of the discharged deposition material.

8. The method of claim 6, wherein the connection member seals a space between the deposition source, the deposition source nozzle unit, and the patterning slit sheet from external air.

9. The method of claim 6, wherein:
the patterning slit sheet is fixed by the connection member by a predetermined distance from the deposition source.

10. The method of claim 5, wherein the thin film deposition apparatus is separated from the substrate by a predetermined distance.

11. The method of claim 5, wherein the deposition material discharged from the thin film deposition apparatus is continuously deposited on the substrate while the substrate is moved relative to the thin film deposition apparatus in the first direction.

12. The method of claim 5, wherein the patterning slit sheet of the thin film deposition apparatus is smaller than the substrate.

13. The method of claim 5, wherein the thin film deposition apparatus further comprises a correction plate disposed between the deposition source nozzle unit and the substrate so as to block at least some of the deposition material discharged from the deposition source.

14. The method of claim 13, wherein the correction plate is disposed so that the thin film formed on the substrate has a constant thickness on the entire substrate.

15. The method of claim 13, wherein the correction plate has a height in the first direction that is gradually reduced as a function of a distance from a center portion of the patterning slit sheet.

16. The method of claim 15, wherein the correction plate has a circular arc shape or a cosine curve shape.

17. The method of claim 13, wherein the correction plate is formed so as to block more deposition material at a center portion of the patterning slit sheet than the deposition material blocked on end portions of the patterning slit sheet.

18. The method of claim 5, wherein each of the plurality of patterning slits is formed to have a different length extending in the first direction from an adjacent one of the patterning slits.

19. The method of claim 18, wherein, the plurality of patterning slits are disposed so that the thin film. formed on the substrate has a constant thickness on the entire substrate.

20. The method of claim 18, wherein an amount of the deposition materials deposited on the substrate is controlled according to the lengths of the patterning slits.

21. The method of claim 18, wherein the length of the patterning slit located at a center portion of the patterning slit sheet is shorter than the lengths of the patterning slits located at end portions of the patterning slit sheet.

22. The method of claim 5, wherein each of the plurality of deposition source nozzles is tilted at a corresponding predetermined angle.

23. The method of claim 22, wherein:
the plurality of deposition source nozzles include deposition source nozzles arranged in two rows formed in the first direction, and
the deposition source nozzles in the two rows are tilted towards each other.

24. The method of claim 22, wherein:
the plurality of deposition source nozzles include deposition source nozzles arranged in two rows formed in the first direction,
the deposition source nozzles arranged in a first row located at a first side of the patterning slit sheet are tilted towards a second side of the patterning slit sheet, and
the deposition source nozzles arranged in a second row located at a second side of the patterning slit sheet are tilted towards the first side of the patterning slit sheet.

25. The method of claim 5, wherein the deposition source comprises:
a first deposition source that discharges a host material, and
a second deposition source that is disposed at a side of the first deposition source and discharges it dopant material.

26. The method of claim 25, wherein at least a part of the host material discharged from the first deposition source and at least a part of the dopant material discharged from the second deposition source are mixed with each other.

27. The method of claim 25, wherein the first deposition source and the second deposition source are aligned in the first direction.

28. The method of claim 27, wherein the deposition source nozzle unit comprises:
a first deposition source nozzle unit disposed at a side of the first deposition source and includes a first plurality of the deposition source nozzles arranged in the first direction, and
a second deposition source nozzle unit disposed at a side of the second deposition source and includes a second plurality of deposition source nozzles arranged in the first direction.

29. The method of claim 28, wherein each of the plurality of deposition source nozzles is tilted at a corresponding predetermined angle.

30. The method of claim 29, wherein:
the first plurality of deposition source nozzles of the first deposition source nozzle unit is tilted towards the second plurality of deposition source nozzles, and
the second plurality of deposition source nozzles of the second deposition source nozzle unit is tilted towards the first plurality of deposition source nozzles.

31. The method of claim 29, wherein the deposition source nozzles are tilted such that the host material and the dopant material are mixed in a constant mixture ratio when deposited throughout the entire substrate.

32. The method of claim 29, wherein the first deposition source and the second deposition source comprise respective linear sources.

33. The method of claim 25, wherein:
the first deposition source comprises a linear source, and
the second deposition source comprises one or more point sources.

34. The method of claim 25, wherein:
the first deposition source is a revolver comprising a plurality of point sources, and
the second deposition source comprises one or more point sources.

35. The method of claim 5, wherein the thin film deposition apparatus comprises a plurality of thin film deposition assemblies, each thin film deposition assembly comprising the deposition source, the deposition source nozzle unit, and the patterning slit sheet.

36. The method of claim 1, wherein the method utilizes the thin film deposition apparatus comprising a plurality of thin film deposition assemblies, each of the thin film deposition assemblies comprising:
a deposition source that discharges the deposition material;
the deposition source nozzle unit disposed at a side of the deposition source. and including the plurality of deposition source nozzles arranged in the first direction; and
the patterning slit sheet disposed opposite to the deposition source nozzle unit and including the plurality of patterning slits arranged in the row in the second direction that is perpendicular to the first direction,
wherein:
depositing the passed deposition material is performed while the substrate is moved relative to the thin film deposition apparatus in the first direction.

37. The method of claim 36, wherein, for each of the thin film deposition assemblies, the deposition source, the deposition source nozzle unit, and the patterning slit, sheet in each of the thin film deposition assemblies are formed integrally.

38. The method of claim 37, wherein each of the thin film deposition assemblies further comprises the connection member which connects the deposition source, the deposition source nozzle unit, and the patterning slit sheet.

39. The method of claim 38, wherein, for each of the thin film deposition assemblies, the connection member guides movement of the discharged deposition material.

40. The method of claim 38, wherein, for each of the thin film deposition assemblies, the connection member seals a space between the deposition source, the deposition source nozzle unit, and the patterning slit sheet.

41. The method of claim 36, wherein the thin film deposition apparatus is separated from the substrate by a predetermined distance.

42. The method of claim 36, wherein the deposition material discharged from the thin film deposition apparatus is continuously deposited on the substrate while the substrate is moved relative to the thin film deposition apparatus in the first direction.

43. The method of claim 36, wherein each of the patterning slit sheets is smaller than the substrate.

44. The method of claim 36, wherein the deposition sources respectively contain different deposition materials.

45. The method of claim 36, wherein the deposition materials respectively contained in the deposition sources are simultaneously deposited on the substrate.

46. The method of claim 36, wherein the thin film deposition apparatus further comprises a further thin film deposition assembly including a further thin film deposition source, a further deposition source nozzle unit, and a further patterning slit sheet, wherein the deposition materials respectively contained in the deposition sources of the thin film deposition assemblies comprise materials for forming red, green and blue emission layers.

47. The method of claim 36, wherein deposition temperatures of the deposition sources are separately controllable.

48. The method of claim 36, wherein deposition amounts of the deposition materials discharged from the deposition sources are separately controllable.

49. The method of claim 1, wherein the method utilizes the thin film deposition apparatus comprising:
a deposition source that houses and discharges the deposition material through the deposition source nozzle unit; and
the patterning slit sheet having the plurality of patterning slits through which the deposition material passes after being discharged through the deposition source nozzle unit, the patterning slit sheet having it length which is substantially less than a length of the substrate,
wherein the thin film is formed along the length of the substrate by depositing the deposition material during the relative motion between the patterning slit sheet and the substrate.

50. The method of claim 49, wherein a width of the patterning slit sheet is less than a width of the substrate.

51. The method of claim 49, wherein each of the patterning slits has a same size.

52. The method of claim 49, wherein a size of each of the patterning slits is a function of a distance from a center of the patterning slit sheet.

53. The method of claim 49, wherein the patterning slits through which the deposition material is passed are disposed in the row extending along a width of the patterning slit sheet.

54. The method of claim 53, wherein:
the deposition source nozzle unit comprises a row of the deposition source nozzles extending towards the patterning silt sheet and through which the deposition material passes towards the patterning slits, and
the row of the deposition source nozzles extends along the length of the patterning slit sheet.

55. The method of claim 54, wherein at least one of the nozzles is angled such that the deposition material is ejected from the at least one of the nozzles in a direction which is not perpendicular to the patterning slit sheet.

56. The method of claim 49, wherein:
the deposition material comprises a first material and a second material, and
the deposition source comprises a first crucible which houses the first material and a second crucible which houses the second material.

* * * * *